US012274016B2

(12) United States Patent
Liu et al.

(10) Patent No.: US 12,274,016 B2
(45) Date of Patent: *Apr. 8, 2025

(54) DISPLAY DEVICE INCLUDING A MOTOR CONFIGURED TO ROTATE A DISPLAY ASSEMBLY

(71) Applicants: Beijing BOE Optoelectronics Technology Co., Ltd., Beijing (CN); BOE Technology Group Co., Ltd., Beijing (CN)

(72) Inventors: Yuhong Liu, Beijing (CN); Zhanshan Ma, Beijing (CN); Zheng Ge, Beijing (CN); Jiyang Shao, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/212,749

(22) Filed: Jun. 22, 2023

(65) Prior Publication Data

US 2023/0337383 A1 Oct. 19, 2023

Related U.S. Application Data

(63) Continuation-in-part of application No. 17/434,024, filed as application No. PCT/CN2020/130098 on Nov. 19, 2020, now Pat. No. 11,721,251.

(51) Int. Cl.
*H05K 5/02* (2006.01)
*H05K 5/03* (2006.01)
*H05K 7/20* (2006.01)

(52) U.S. Cl.
CPC ............. *H05K 5/0234* (2013.01); *H05K 5/03* (2013.01); *H05K 7/20972* (2013.01)

(58) Field of Classification Search
None
See application file for complete search history.

(56) References Cited

U.S. PATENT DOCUMENTS 6,502,338 B1 1/2003 Marshall et al.
2002/0067467 A1 6/2002 Dorval et al.
(Continued)

FOREIGN PATENT DOCUMENTS

CN 101038421 A 9/2007
CN 201035487 Y 3/2008
(Continued)

OTHER PUBLICATIONS

International search report of PCT application No. PCT/CN2020/130098 issued on Aug. 24, 2021.
(Continued)

*Primary Examiner* — Kirk W Hermann
(74) *Attorney, Agent, or Firm* — Lippes Mathias LLP

(57) ABSTRACT

A display device for presenting 3D images is provided. The display device includes: a display assembly; a hollow housing assembly; a motor connected to the display assembly; a driving assembly connected to the display assembly; and a hollow base assembly; wherein the driving assembly comprises a power transmission structure and a power reception structure, the power transmission structure is independent from the display assembly and wiredly connected to a first driving power supply, and the power reception structure is wiredly connected to the display assembly and capable of delivering power to the power reception structure by electromagnetic mutual inductance; and the base assembly comprises a first cylinder and a first plate fixedly connected to
(Continued)

one end of the first cylinder; the first plate comprises a plate body and a cushion, and the cushion covers a side, proximal to the first cylinder, of the plate body.

20 Claims, 18 Drawing Sheets

(56) References Cited

U.S. PATENT DOCUMENTS

| | | | |
|---|---|---|---|
| 2011/0234772 A1 | 9/2011 | Ito et al. | |
| 2013/0100126 A1* | 4/2013 | Kim | H04N 13/393 |
| | | | 345/419 |
| 2019/0251882 A1 | 8/2019 | Nocon | |
| 2019/0378444 A1* | 12/2019 | Hsu | G09G 3/005 |
| 2021/0306612 A1 | 9/2021 | Ma et al. | |

FOREIGN PATENT DOCUMENTS

| | | | | |
|---|---|---|---|---|
| CN | 101425242 A | 5/2009 | | |
| CN | 102239438 A | 11/2011 | | |
| CN | 202093312 U | 12/2011 | | |
| CN | 102568330 A | 7/2012 | | |
| CN | 103207513 A | 7/2013 | | |
| CN | 103325321 A | 9/2013 | | |
| CN | 104010186 A * | 8/2014 | | |
| CN | 106094232 A | 11/2016 | | |
| CN | 206711509 U | 12/2017 | | |
| CN | 207052216 U | 2/2018 | | |
| CN | 108630133 A | 10/2018 | | |
| CN | 208256206 U | 12/2018 | | |
| CN | 109450111 A | 3/2019 | | |
| CN | 109686270 A * | 4/2019 | | G09F 9/37 |
| CN | 110299094 A | 10/2019 | | |
| CN | 110503908 A | 11/2019 | | |
| CN | 110807995 A | 2/2020 | | |
| CN | 210136684 U | 3/2020 | | |
| CN | 210429150 U | 4/2020 | | |
| CN | 210743455 U | 6/2020 | | |
| CN | 111447433 A | 7/2020 | | |
| CN | 111462647 A | 7/2020 | | |
| CN | 210925337 U | 7/2020 | | |
| CN | 211016316 U | 7/2020 | | |
| CN | 112840531 A | 5/2021 | | |
| CN | 213424455 U | 6/2021 | | |
| CN | 113724620 A * | 11/2021 | | |
| EP | 1838110 B1 | 3/2010 | | |

OTHER PUBLICATIONS

Non-final office Action of U.S. Appl. No. 17/434,024 issued on Dec. 5, 2022.

Notice of allowance of U.S. Appl. No. 17/434,024 issued on Mar. 22, 2023.

China National Intellectual Property Administration, First office action of Chinese application No. 202080002899.4 issued on Oct. 25, 2023, which is foreign counterpart application of this US application.

* cited by examiner

DISPLAY DEVICE INCLUDING A MOTOR CONFIGURED TO ROTATE A DISPLAY ASSEMBLY

This application is a continuation in part application of U.S. application Ser. No. 17/434,024, filed on Aug. 26, 2021, which is a 371 of PCT application No. PCT/CN2020/130098, filed on Nov. 19, 2020, the disclosure of both of which is herein incorporated by reference in its entirety.

TECHNICAL FIELD

The present disclosure relates to the field of display technologies, and in particular, relate to a display device.

BACKGROUND

With development of display technologies, three-dimensional (3D) display devices are widely concerned for viewing 3D images without requiring viewers to wear glasses, helmets, or other devices.

SUMMARY

The present disclosure provides a display device. The technical solutions are as below.

According to an aspect, there is provided a display device. The display device includes:
 a display assembly,
 a hollow housing assembly, wherein the display assembly is disposed in the housing assembly;
 a motor connected to the display assembly and configured to drive the display assembly to rotate;
 a driving assembly connected to the display assembly and configured to drive the display assembly to display images; and
 a hollow base assembly disposed at a side, proximal to the motor, of the housing assembly and fixedly connected to the housing assembly, the motor being disposed within and fixedly connected to the base assembly;
 wherein the driving assembly includes a power transmission structure and a power reception structure, wherein the power transmission structure is independent from the display assembly and wiredly connected to a first driving power supply, and the power reception structure is wiredly connected to the display assembly and capable of delivering power to the power reception structure by electromagnetic mutual inductance; and
 the base assembly includes a first cylinder and a first plate fixedly connected to one end of the first cylinder; the first plate includes a plate body, and a cushion which is fixedly connected to the plate body; and, the cushion covers a side, proximal to the first cylinder, of the plate body.

In some possible implementations, the first plate further includes a support cushion which is fixedly connected to the plate body, and the support cushion is disposed at a side, distal from the first cylinder, of the plate body.

In some possible implementations, the display device further includes a motor housing;
 wherein the motor housing is fixedly connected to the motor and one of the housing assembly and the first plate.

In some possible implementations, the display device further includes a circuit assembly;
 wherein the circuit assembly is fixedly connected to both the display assembly and the power reception structure and configured to drive the display assembly to display the images under an action of power received by the power reception structure.

In some possible implementations, the power reception structure includes a receiving plate, the receiving plate being provided with a first through hole, and the circuit assembly includes a first support plate, a first circuit board, a second support plate, and a support shaft; wherein
 the first circuit board is disposed between the first support plate and the second support plate, the first support plate is fixedly connected to both the first circuit board and the second support plate, a side, distal from the second support plate, of the first support plate is fixedly connected to the display assembly, and a side, distal from the first support plate, of the second support plate is fixedly connected to the receiving plate; and
 the side, distal from the first support plate, of the second support plate is fixedly connected to the support shaft, an axis of the support shaft is perpendicular to the second support plate, and the support shaft is disposed in the first through hole.

In some possible implementations, the power reception structure further includes a second circuit board; the side, distal from the second support plate, of the first support plate is fixedly connected to the second circuit board, and a side, distal from the first support plate, of the second circuit board is fixedly connected to the display assembly.

In some possible implementations, the power reception structure further includes a first flexible circuit board, the first support plate has an opening, and the first circuit board of the circuit assembly is connected to the second circuit board through the first flexible circuit which passes through the opening of the first support plate.

In some possible implementations, the second circuit board is provided with a hole in the center for the support shaft to pass through.

In some possible implementations, the hole has a shape of a regular pentagon, and an outer edge of the second circuit board has a shape of regular decagon.

In some possible implementations, the support shaft is fixedly connected to an output shaft of the motor, to allow the power reception structure to synchronously rotate with the display assembly when driven by the motor.

In some possible implementations, the display device further includes a heat radiation assembly and a second bearing; wherein
 the heat radiation assembly is fixedly connected to one end, distal from the second plate, of the second cylinder of the housing assembly;
 an outer wall of the second bearing is fixedly connected to the heat radiation assembly, the second bearing is sleeved on the support shaft, and the support shaft is rotatably connected to the second bearing; and
 the heat radiation assembly is further fixedly connected to the power transmission structure.

In some possible implementations, the display device further includes an upper cover assembly;
 wherein the upper cover assembly is disposed at a side, distal from the housing assembly, of the heat radiation assembly and fixedly connected to the heat radiation assembly.

In some possible implementations, the heat radiation assembly further includes a fan and a fan connecting plate fixedly connected to the fan, and the upper cover assembly includes a cylindrical cover body and a cover plate; wherein the fan connecting plate is disposed at and fixedly connected to a side, proximal to the housing assembly, of the cover body; and the cover plate is disposed at and fixedly connected to a side, distal from the housing assembly, of the cover body.

In some possible implementations, wherein a side, distal from the fan connecting plate, of the cover body is provided with a second groove, and the upper cover assembly further includes at least one support column, a first magnet, and a second magnet; wherein each of the at least one support column is disposed at the side, distal from the housing assembly, of the cover body, one end of the each of the at least one support column is fixedly connected to an inner wall of the second groove, and the other end of the each of the at least one support column is fixedly connected to the first magnet; and the second magnet is disposed at a side, proximal to the second groove, of the cover plate.

In some possible implementations, a side wall of the first cylinder is provided with a first power supply interface and a second power supply interface; wherein the first power supply interface is connected to the driving assembly and configured to be connected to the first driving power supply; and the second power supply interface is connected to the motor and configured to be connected to a second driving power supply, and the second driving power supply is configured to supply power to the motor.

In some possible implementations, the base assembly further includes a rubber plug configured to seal the first power supply interface and the second power supply interface.

In some possible implementations, the display assembly includes circular plate, a backplane bracket and a display module; a base of the backplane bracket is fixedly connected to a side, distal from the driving assembly, of the circular plate, the backplane bracket provides a mounting surface, which is perpendicular to the circular plate, for the display module, and the display module is fixedly mounted to the backplane bracket.

In some possible implementations, the display assembly further includes a second flexible circuit board, and the display module is connected to the driving assembly through the second flexible circuit board.

In some possible implementations, motor is fixed in the center of the first plate by the motor housing which is fixedly connected to the first plate, and the motor housing includes a through hole for an output shaft of the motor to pass through.

In some possible implementations, the output shaft of the motor includes at least one flat key structure.

BRIEF DESCRIPTION OF THE DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION

To make the objectives, technical solutions and advantages of the present disclosure clearer, the followings describe the embodiments of the present disclosure in detail with reference to the drawings.

In the related art, a 3D display device includes a display assembly and a motor and a driving assembly which are connected to the display assembly. The motor can drive the display assembly to rotate, and the driving assembly can drive the display assembly to display images. The display assembly displays images to present 3D images by using persistence of vision of human eyes during a process in which the motor drives the display assembly to rotate.

However, in order to enable the driving assembly to drive the display assembly to display images, the driving assembly needs to be connected to an external driving power supply over a power line in addition to being connected to the display assembly. The power supply line is not conducive to the rotation of the display assembly, leading a poor display effect of the 3D display device.

Figure 1:
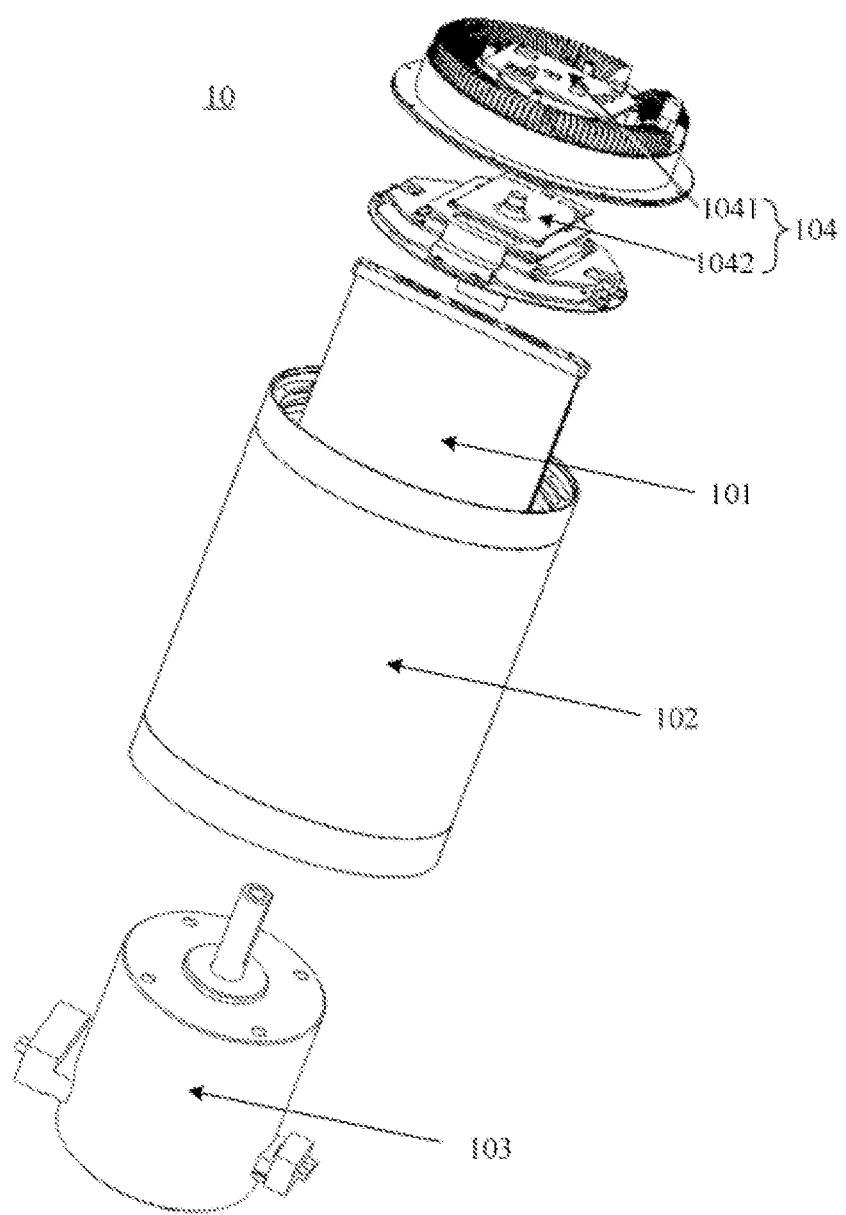
FIG. 1 is a schematic structural diagram of a display device according to an embodiment of the present disclosure.

FIG. 1 is a schematic structural diagram of a display device according to an embodiment of the present disclosure. As can be seen from FIG. 1, the display device 10 may include a display assembly 101, a hollow housing assembly 102, a motor 103 and a driving assembly 104.

The display assembly 101 is disposed within the hollow housing assembly 102. The motor 103 is connected to the display assembly 101 and configured to drive the same to rotate. The driving assembly 104 may be connected to the display assembly 101 and configured to drive the same to display images. In this way, when the motor 103 drives the display assembly 101 to rotate, the driving assembly 104 drives the display assembly 101 to display images, thereby achieving a 3D image effect.

Referring to FIG. 1, the driving assembly 104 includes a power transmission structure 1041 and a power reception structure 1042. For example, the power transmission structure 1041 is a wireless power transmission structure, and the power reception structure 1042 is a wireless power reception structure. The power transmission structure 1041 is independent from the display assembly 101 and wiredly connected to a first driving power supply. The first driving power supply is configured to supply power to the power transmission structure 1041. The power reception structure 1042 is wiredly connected to the display assembly 101, and the power transmission structure 1041 is capable of delivering power to the power reception structure 1042 by electromagnetic mutual inductance. In this way, the power reception structure 1042 can deliver received power to the display assembly 101, such that the display assembly 101 can display images.

Since the power reception structure 1042 is wiredly connected to the display assembly 101, the power reception structure 1042 can rotate synchronously with the display assembly 101 when the motor 103 drives the display assembly 101 to rotate. The power transmission structure 1041 independent from the display assembly 101 does not rotate synchronously with the display assembly 101. In this way, the driving wiring that connects the first driving power supply and the power transmission structure 1041 does not influence the rotation of the display assembly 101, thereby ensuring a display effect of the display device.

In summary, according to the display device provided by an embodiment of the present disclosure, a power transmission structure can deliver power provided by a first driving power supply to a power reception structure by electromagnetic mutual inductance, and the power reception structure can further deliver power to a display assembly. Since the power transmission structure is independent from the display assembly, when the display assembly is driven by a motor to rotate, a driving wiring that connects the power transmission structure and the first driving power supply does not influence the rotation of the display assembly, thereby achieving a good display effect of the display device.

Figure 2:
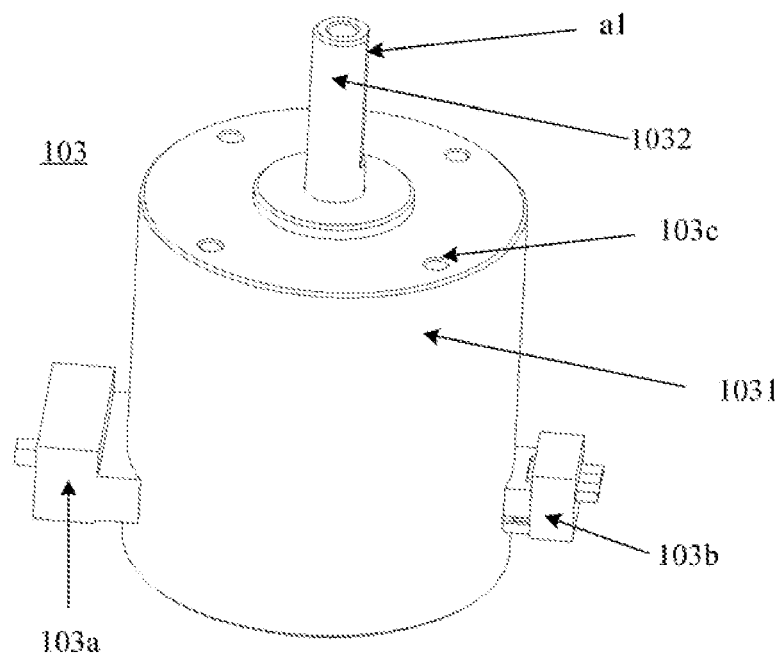
FIG. 2 is a schematic structural diagram of a motor according to an embodiment of the present disclosure.

FIG. 2 is a schematic structural diagram of a motor according to an embodiment of the present disclosure. As can be seen from FIG. 2, the motor 103 includes a motor body 1031 and an output shaft 1032 connected to the motor body 1031.

Figure 3:
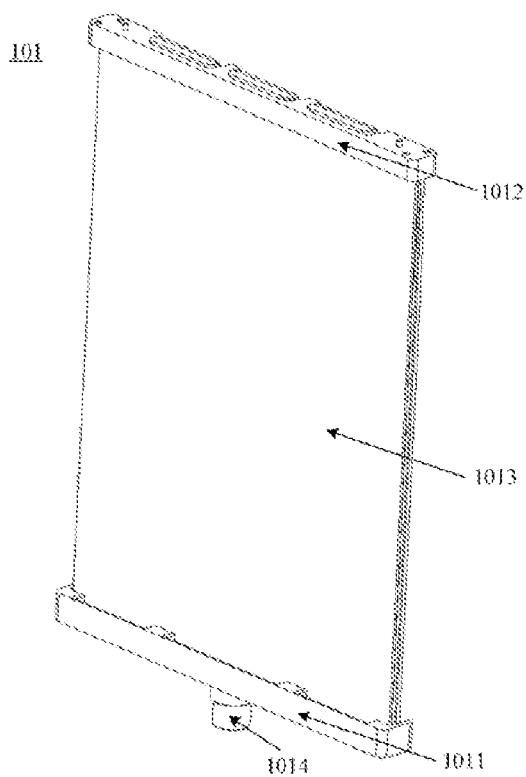
FIG. 3 is a schematic structural diagram of a display assembly according to an embodiment of the present disclosure.
Figure 4:
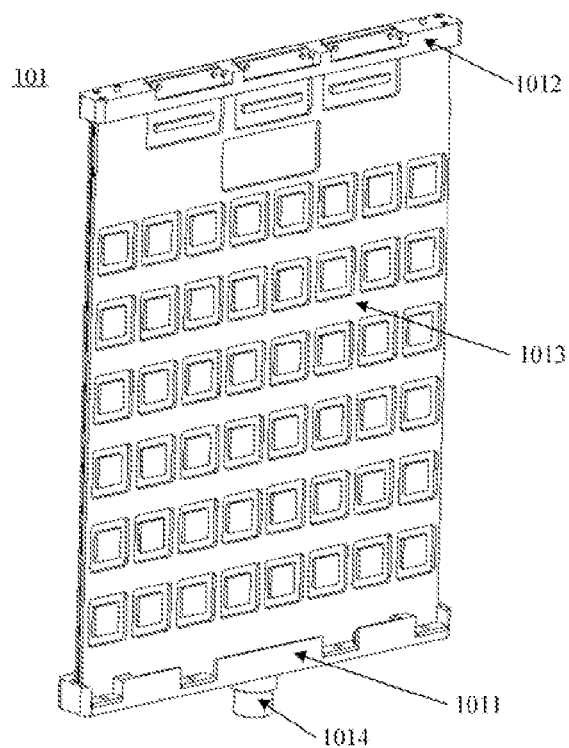
FIG. 4 is a schematic structural diagram of a display assembly according to another embodiment of the present disclosure.

FIG. 3 is a schematic structural diagram of a display assembly according to an embodiment of the present disclosure. FIG. 4 is a schematic structural diagram of a display assembly according to another embodiment of the present disclosure. As can be seen from FIGS. 3-4, the display assembly 101 includes a first bracket 1011, a second bracket 1012, a display module 1013, and a connecting shaft 1014 fixedly connected to the first bracket 1011. The display module 1013 is fixed between the first bracket 1011 and the second bracket 1012. That is, the display module 1013 is fixedly connected to both the first bracket 1011 and the second bracket 1012.

Further, the second bracket is fixedly connected to the power reception structure 1042. The connecting shaft 1014 of the motor 103 is disposed at a side, distal from the display module 1013, of the first bracket 1011, the connecting shaft 1014 is provided with a fourth through hole (not shown in the figures), and the output shaft 1032 of the motor 103 is disposed in the fourth through hole. That is, the output shaft 1032 of the motor 103 is connected to the connecting shaft 1014 of the display assembly 101, such that the motor 103 can drive the display assembly 101 to rotate.

As can be seen from FIG. 2, part of a side surface of the output shaft 1032 is a first plane al. Accordingly, part of a side surface of an inner wall of the fourth through hole of the connecting shaft 1014 connected to the output shaft 1032 is a second plane (not shown in the figures) matched with the first plane al, and the first plane al is in contact with the second plane.

The part of the side surface of the output shaft 1032 and the part of the side surface of the inner wall of the fourth through hole are designed to be flat, which can avoid relative rotation of the output shaft 1032 and the connecting shaft 1014 during driving the display assembly 101 to rotate by the motor 103, thereby ensuring that the motor 103 can effectively deliver power to the display assembly 101.

In this embodiment of the present disclosure, the connecting shaft 1014 is disposed in the middle of the first bracket 1011, such that a center line of the display module 1013 and an axis of the connecting shaft 1014 are collinear, where an axis of the connecting shaft 1014 is a rotation axis of the display assembly 101. The display module 1013 is symmetrical about the rotation axis, that is, the gravity center of the display module 1013 is located on the rotation axis, thereby achieving stable rotation of the display assembly 101.

Figure 5:
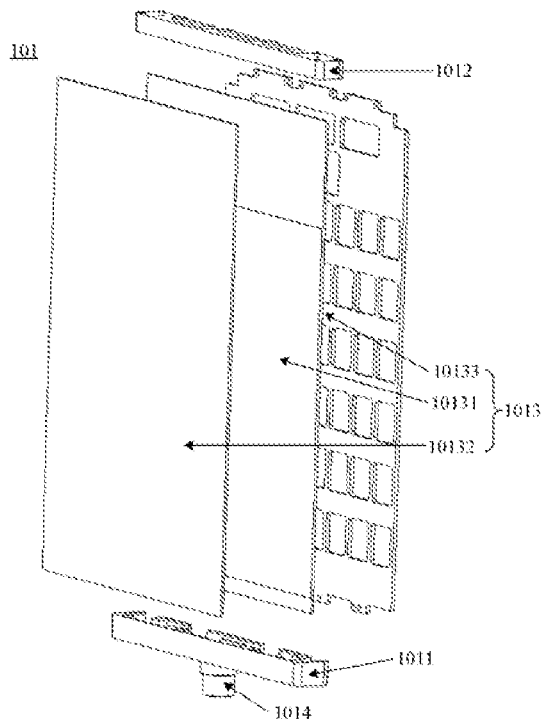
FIG. 5 is an exploded schematic diagram of the display assembly shown in FIG. 3.

FIG. 5 is an exploded schematic diagram of the display assembly shown in FIG. 3. As can be seen from FIG. 5, the display module 1013 includes a display panel 10131, a light homogenizing plate 10132 and a support plate 10133.

The light homogenizing plate 10132 is disposed on the light emitting surface of the display panel 10131, and the light homogenizing plate 10132 is fixedly connected to the light emitting surface of the display panel 10131. The light homogenizing plate 10132 can be used to homogenize light emitted from the display panel 10131. The support plate 10133 is disposed on the non-light emitting surface of the display panel 10131, the support plate 10133 is fixedly connected to the light emitting surface of the display panel 10131, and the support plate 10133 is configured to support the display panel 10131.

Optionally, both sides of the support plate 10133 includes through holes, and the through holes are configured to be fixedly connected to the first bracket 1011 and the second bracket 1012. Further, since the support plate 10133 can be connected to the display panel 10131, and the display panel 10313 is connected to the light homogenizing plate 10132, locations of the display panel 10131, the light homogenizing plate 10132, and the support plate 10133 are all fixed relative to the first bracket 1011 and the second bracket 1012.

In this embodiment of the present disclosure, the light emitting surface of the display panel 10131 and the light homogenizing plate 10132 may be pasted with a double-sided tape, and the non-light emitting surface of the display panel 10131 and the support plate 10133 may be pasted with a double-sided tape. Further, the support plate 10133 may be made of a carbon fiber material, that is, the support plate 10133 may be a carbon fiber plate with advantages of high tensile strength and low density.

Figure 6:
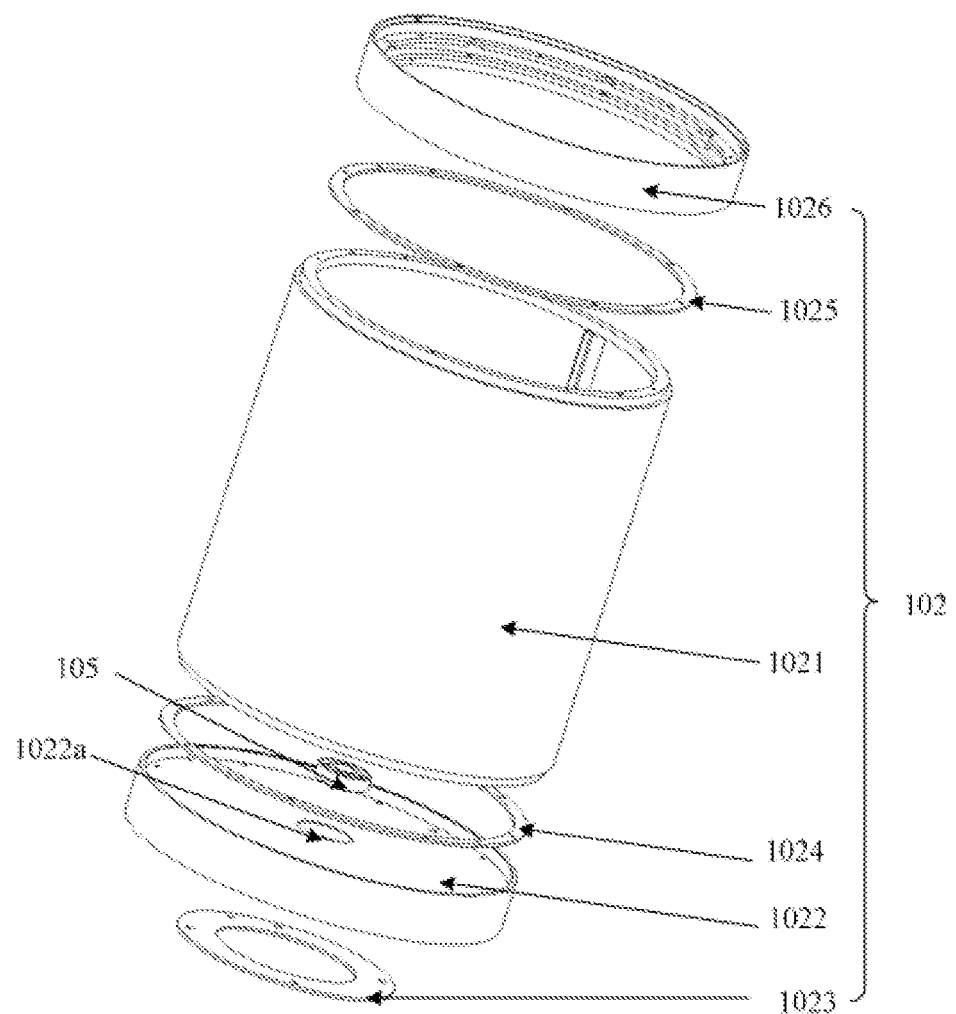
FIG. 6 is a schematic structural diagram of a housing assembly according to an embodiment of the present disclosure.

FIG. 6 is a schematic structural diagram of a housing assembly according to an embodiment of the present disclosure. As can be seen from FIG. 6, the housing assembly 102 may include a second cylinder 1021 and a second plate 1022 fixedly connected to one end of the second cylinder 1021. The second plate 1022 is provided with a second through hole 1022a, and an axis of the second through hole 1022a is collinear with an axis of the second cylinder 1021.

Optionally, the display assembly 101 is disposed in the second cylinder 1021, and the second cylinder 1021 may be made of a transparent material, such that a user can view, through the second cylinder 1021, images displayed by the display assembly 101 which is disposed in the second cylinder 1021. Certainly, the second cylinder 1021 may also be made of a translucent material, which is not limited in this embodiment of the present disclosure.

Referring to FIG. 6, the display device 10 may further include a first bearing 105. The first bearing 105 is disposed in the second through hole 1022a, and an outer wall of the first bearing 105 is fixedly connected to the second plate 1022 via the second through hole 1022a. The first bearing 105 is sleeved on the connecting shaft 1014, and the connecting shaft 1014 is connected to the first bearing 105 rotatably.

The first bearing 105 is sleeved on the connecting shaft 1014, such that the first bearing 105 can provide effective support for the rotation of the connecting shaft 1014, and ensure reliability of the rotation of the display assembly 101.

Figure 7:
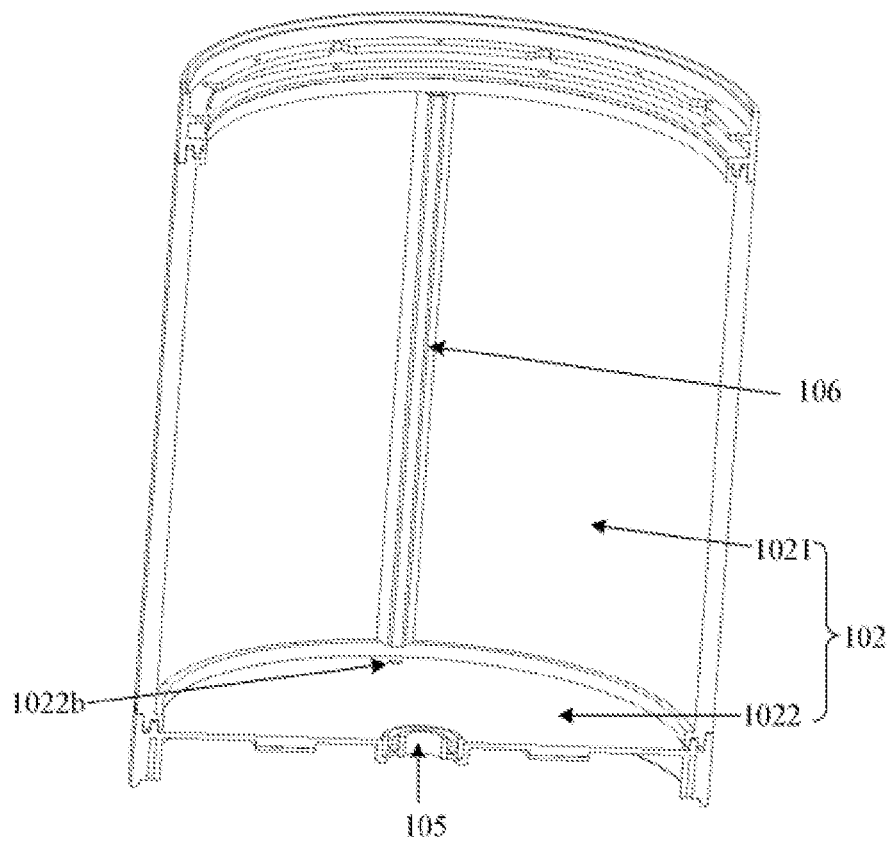
FIG. 7 is a schematic structural diagram of a housing assembly according to another embodiment of the present disclosure.

FIG. 7 is a schematic structural diagram of a housing assembly according to another embodiment of the present disclosure. As can be seen from FIG. 7, the second plate 1022 is further provided with a third through hole 1022b which is disposed at an edge of the second plate 1022, and the display device 10 may further include a driving wiring (not shown in the figure) and a strip-shaped first wiring housing 106.

The first wiring housing 106 is fixedly connected to an inner wall of the second cylinder 1021, and a gap is defined between the first wiring housing 106 and the inner wall of the second cylinder 1021. One end of the driving wiring is connected to the power transmission structure 1041. The other end of the driving wiring passes through the gap between the first wiring housing 106 and the inner wall of the second cylinder 1021 and passes through the third through hole 1022b, and is configured to be connected to the first driving power supply. In other words, the power transmission structure 1041 can be connected to the first driving power supply via the driving wiring, such that the first driving power supply supplies power to the power transmission structure 1041.

In this embodiment of the present disclosure, if the first driving power supply and the driving assembly 104 are disposed on different sides of the housing assembly 102, the driving wiring needs to pass through the housing assembly 102, so as to connect the first driving power supply to the power transmission structure 1041 of the driving assembly 104. Since the rotatable display assembly 101 is disposed in the housing assembly 102, the first wiring housing 106 is disposed on the inner wall of the second cylinder 1021 of the housing assembly 102, such that the driving wiring is disposed in the gap between the first wiring housing 106 and the inner wall of the second cylinder 1021. In this way, the driving wiring is prevented from affecting the rotation of the display assembly 101, thereby ensuring a display effect of the display assembly 101.

Referring to FIG. 6, the housing assembly 102 may further include a first gasket 1023, a second gasket 1024, a third gasket 1025 and a cap 1026. The first gasket 1023 is bonded to a side, distal from the second cylinder 1021, of the second plate 1022. To be specific, the first gasket 1023 is disposed between the motor 103 and the second plate 1022, and the motor 103 is connected to the second plate 1022 via through holes on the first gasket 1023.

The second gasket 1024 is disposed between the second cylinder 1021 and the second plate 1022, the third gasket 1025 is disposed at a side, distal form the second plate 1022, of the second cylinder 1021, and the cap 1026 is disposed at a side, distal from the second cylinder 1021, of the third gasket 1025. In this way, the second cylinder 1021 is connected to the second plate 1022 via through holes on the second gasket 1024, and the second cylinder 1021 is connected to the cap 1026 via through holes on the third gasket 1025.

Optionally, the first gasket 1023, the second gasket 1024 and the third gasket 1025 are all made of rubber, thereby ensuring sealed connection. Further, referring to FIG. 6, the first gasket 1023, the second gasket 1024 and the third gasket 1025 are all of circular structures.

In this embodiment of the present disclosure, two structures connected to each other have corresponding positioning structures, such that assembly can be performed through the corresponding positioning structures on the two structures to ensure assembly accuracy.

For example, the second plate 1022 is provided with a first positioning structure for assembly with the first gasket 1023, and the first gasket 1023 is provided with a first positioning structure for assembly with the second plate 1022. Therefore, the second plate 1022 and the first gasket 1023 can be assembled by the first positioning structure on the second plate 1022 and the first positioning structure on the first gasket 1023. The second plate 1022 is further provided with a second positioning structure for assembly with the second gasket 1024, and the second gasket 1024 is provided with a first positioning structure for assembly with the second plate 1022. Therefore, the second plate 1022 and the second gasket 1024 can be assembled by the second positioning structure on the second plate 1022 and the first positioning structure on the second gasket 1024.

In this embodiment of the present disclosure, for the corresponding positioning structures on the two structures connected to each other, one may be a positioning hole, and the other may be a positioning rod. The positioning rod is disposed in the positioning hole to achieve positioning. For example, the first positioning structure on the second plate 1022 is a positioning rod, and the first positioning structure on the first gasket 1023 is a positioning hole.

Figure 8:
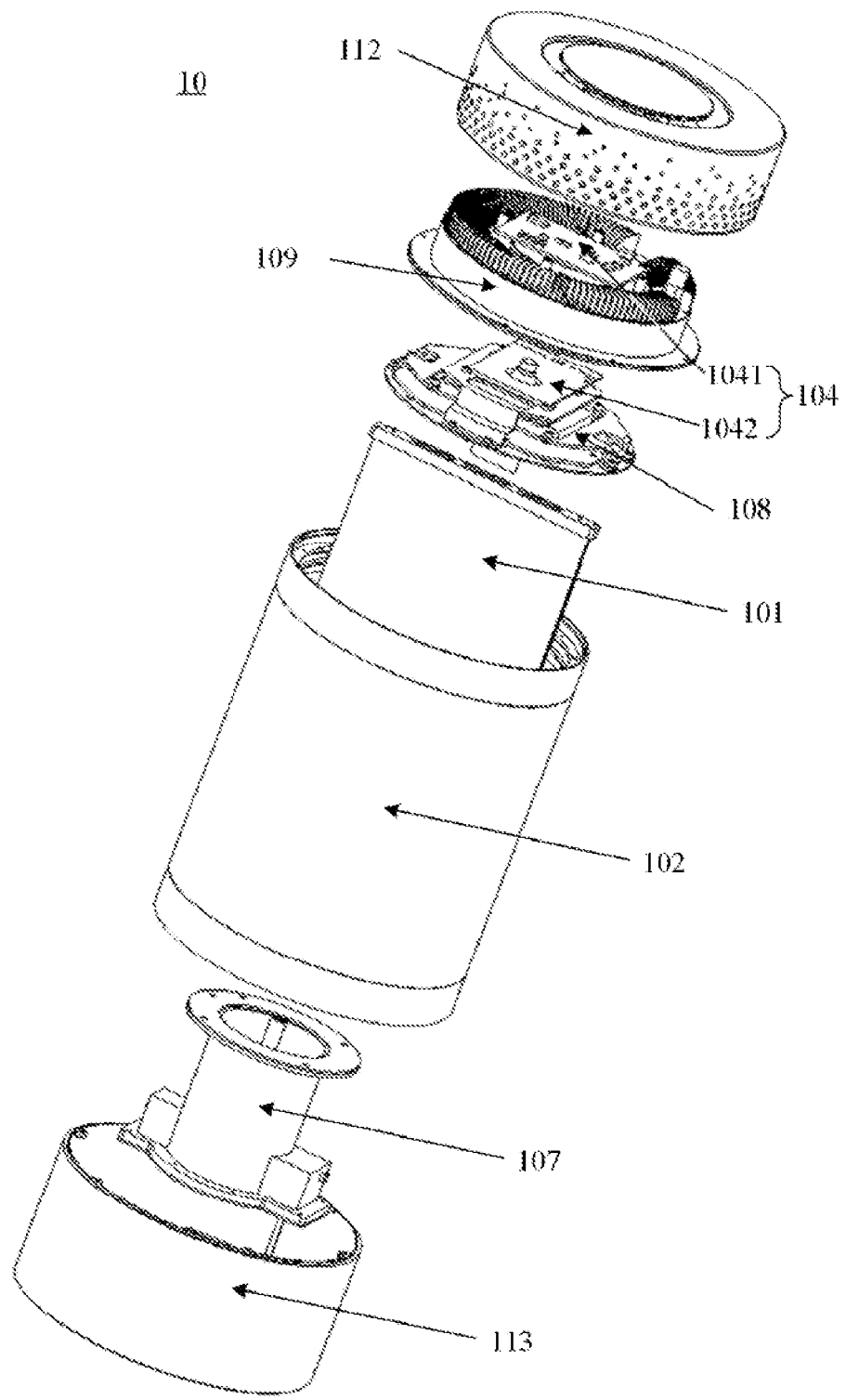
FIG. 8 is a schematic structural diagram of a display device according to another embodiment of the present disclosure.
Figure 9:
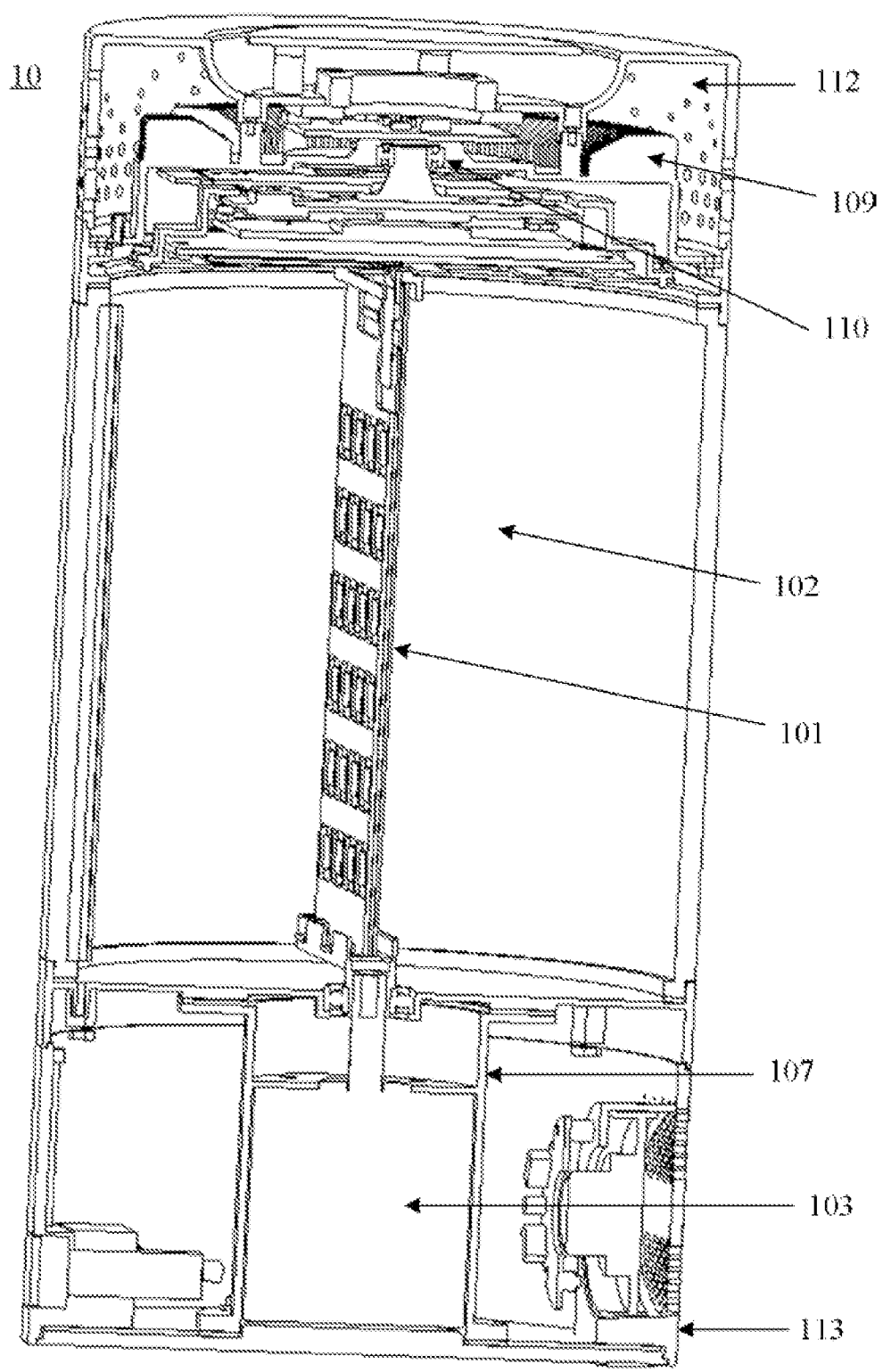
FIG. 9 is a sectional view of the display device shown in FIG. 8.

FIG. 8 is a schematic structural diagram of a display device according to another embodiment of the present disclosure. FIG. 9 is a sectional view of the display device shown in FIG. 8. Referring to FIG. 8 and FIG. 9, the display device may further include a motor housing 107.

Figure 10:
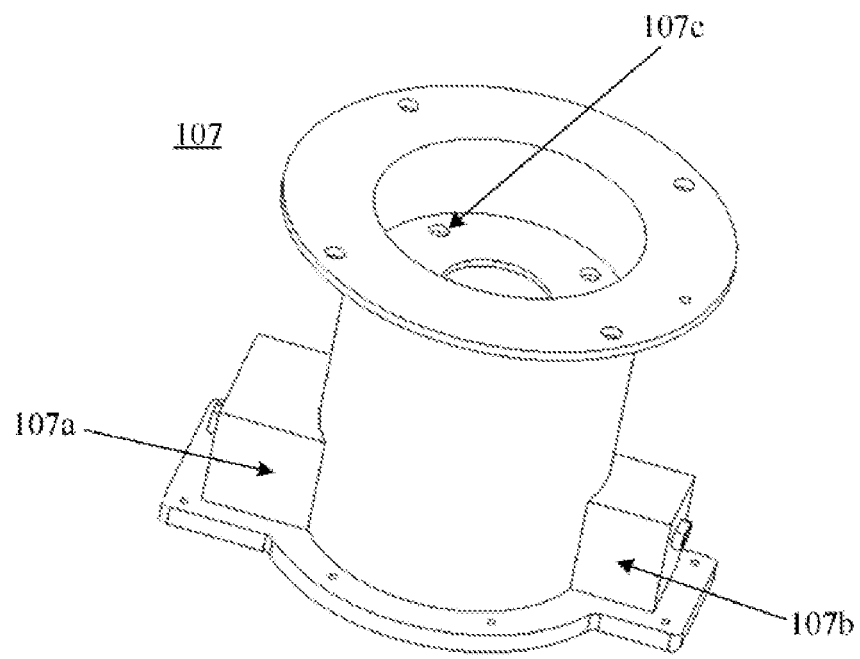
FIG. 10 is a schematic structural diagram of a motor housing according to an embodiment of the present disclosure.
Figure 11:
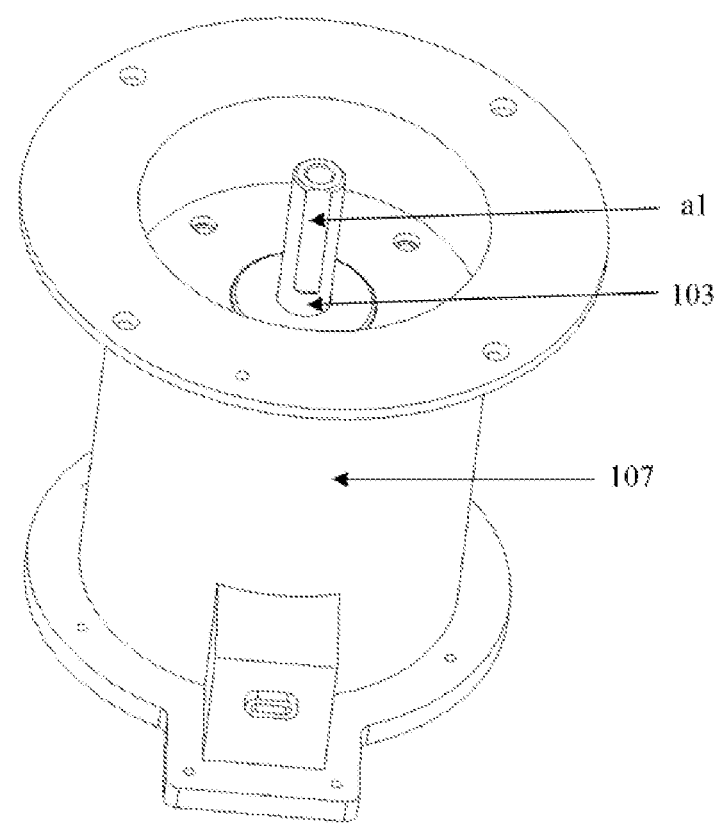
FIG. 11 is a schematic structural diagram of a motor housing and a motor according to an embodiment of the present disclosure.

FIG. 10 is a schematic structural diagram of a motor housing according to an embodiment of the present disclosure. FIG. 11 is a schematic structural diagram of a motor housing and a motor according to an embodiment of the present disclosure. As can be seen from FIGS. 8-11, the motor 103 is disposed in the motor housing 107 which is configured to protect the motor 103 from being damaged.

Further, the motor housing 107 is fixedly connected to both the motor 103 and the housing assembly 102. In this way, relative movement between the motor 103 and the housing assembly 102 can be avoided, and reliability of connection between the motor 103 and the display assembly 101 disposed in the housing assembly 102 can be ensured.

Optionally, the motor housing 107 may be a casing design of the motor 103. The casing design may mean that a shape of a groove in the motor housing 107 for disposing the motor 103 may be the same as an outer shape of the motor 103. The motor housing 107 is connected to the second plate 1022 via the through holes on the first gasket 1023, for example, may be connected by screws. The motor 103 may be a servomotor. Alternatively, the motor 103 may be another type of motor, which is not limited in this embodiment of the present disclosure.

In this embodiment of the present disclosure, the motor housing 107 is provided with a first positioning structure for assembly with the first gasket 1023 of the housing assembly 102, and the first gasket 1023 is provided with a second positioning structure for assembly with the motor housing 107. The motor housing 107 and the first gasket 1023 are assembled by the first positioning structure of the motor housing 107 and the second positioning structure of the first gasket 1023 to ensure assembly accuracy.

As can be seen from FIG. 2, the motor 103 may include a power supply interface 103*a* and a parameter debugging interface 103*b*. The parameter debugging interface 103*b* is used to adjust parameters such as speed and acceleration of the motor 103.

As can be seen from FIGS. 10-11, the motor housing 107 is provided with a first outlet 107*a* corresponding to the power supply interface 103*a*, and a second outlet 107*b* corresponding to the parameter debugging interface 103*b*. After the motor 103 is put into the motor housing 107 from the bottom of the motor housing 107, a power supply lead wire of the motor 103 may be led out from the first outlet 107*a*, and a parameter debugging lead wire of the motor 103 may be led out from the second outlet 107*b*.

In addition, after the power supply lead wire is led out from the first outlet 107*a*, sealant is applied to a gap between the power supply lead wire and the first outlet 107*a* for sealing the power supply lead wire. Further, after the parameter debugging lead wire is led out from the second outlet 107*b*, sealant is applied to a gap between the parameter debugging lead wire and the second outlet 107*b* for sealing the parameter debugging lead wire.

As can be seen from FIG. 2 and FIG. 10, the motor 103 is provided with a first connecting hole 103*c*, the motor housing 107 is provided with a second connecting hole 107*c*, the second connecting hole 107*c* and the first connecting hole 103*c* are provided with screws, and the motor 103 and the motor housing 107 are connected by the screws.

In this embodiment of the present disclosure, an inside of the housing assembly 102 is made vacuum. Since sound (including noise) cannot propagate through vacuum, the housing assembly 102 which is set to be vacuum can effectively reduce noise when the display assembly 101 rotates in the housing assembly 102, such that user experience is better.

As can been seen from FIG. 8, the display device 10 further includes a circuit assembly 108 which is fixedly connected to both the display assembly 101 and the power reception structure 1042. The circuit assembly 108 is configured to drive the display assembly 101 to display the images under an action of power received by the power reception structure 1042.

Since the circuit assembly 108 is fixedly connected to both the display assembly 101 and the power reception structure 1042, when the motor 103 drives the display assembly 101 to rotate, both the circuit assembly 108 and the power reception structure 1042 can rotate synchronously with the display assembly 101.

Figure 12:
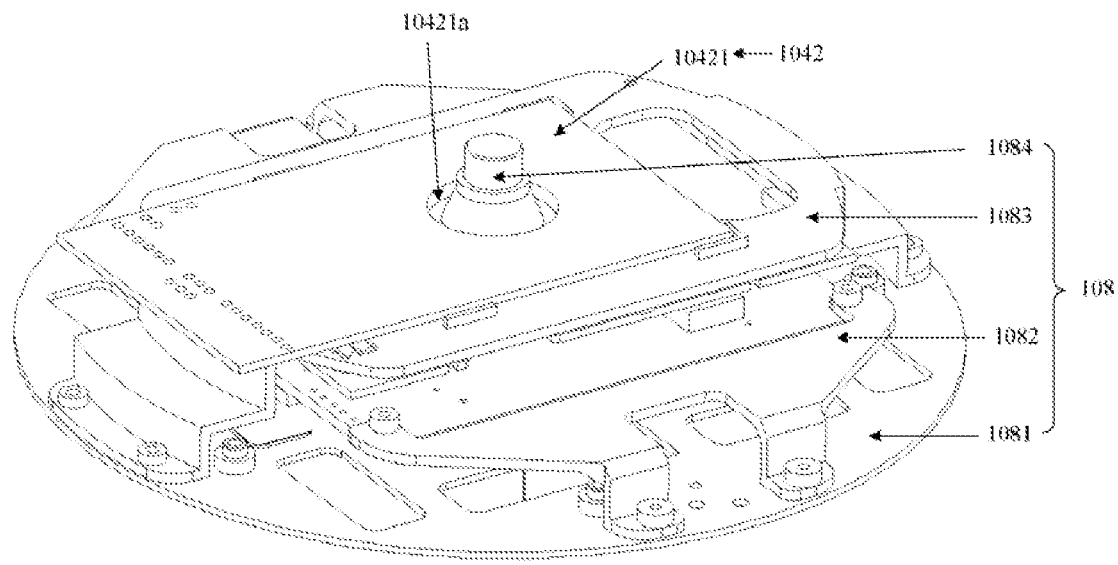
FIG. 12 is a schematic structural diagram of a circuit assembly and a power reception structure according to an embodiment of the present disclosure.

FIG. 12 is a schematic structural diagram of a circuit assembly and a power reception structure according to an embodiment of the present disclosure. As can be seen from FIG. 12, the power reception structure 1042 includes a receiving plate 10421 which is provided with a first through hole 10421*a*. The circuit assembly 108 may include a first support plate 1081, a first circuit board 1082, a second support plate 1083 and a support shaft 1084.

The first circuit board 1082 is disposed between the first support plate 1081 and the second support plate 1083, and the first support plate 1081 is fixedly connected to both the first circuit board 1082 and the second support plate 1083. A side, distal from the second support plate 1083, of the first support plate 1081 is fixedly connected to the display assembly 101, and a side, distal from the first support plate 1081, of the second support plate 1083 is fixedly connected to the receiving plate 10421. The side, distal from the first support plate 1081, of the second support plate 1083 is also fixedly connected to the support shaft 1084, an axis of the support shaft 1084 is perpendicular to the second support plate 1083, and the support shaft 1084 is disposed in the first through hole 10421*a* on the receiving plate 10421.

For example, the axis of the support shaft 1084 is collinear with an axis of the first through hole 10421*a*. In this way, stability of the circuit assembly 108 which rotates with the display assembly 101 can be ensured, and it can be ensured that the circuit assembly 108 can supply power to the display assembly 101.

Optionally, the first circuit board 1082 is fixedly connected to the first support plate 1081 by screws. The second support plate 1083 is disposed at a side, distal from the first support plate 1081, of the first circuit board 1082, and the second support plate 1083 is fixedly connected to the first support plate 1081 by screws.

Further, since the first circuit board 1082 and the second support plate 1083 are disposed on a same side of the first support plate 1081, an orthographic projection of part, configured to be connected to the first support plate 1081, of the first circuit board 1082 onto the first support plate 1081, is not overlapped with an orthographic projection of part, configured to be connected to the first support plate 1081, of the second support plate 1083 onto the first support plate 1081. In this way, the part, configured to be connected to the first support plate 1081, of the first circuit board 1082 and the part, configured to be connected to the first support plate 1081, of the second support plate 1083 can be prevented from affecting each other, thereby ensuring normal operation of the circuit assembly 108.

Optionally, the circuit assembly may further include a flexible circuit board (not shown in the figure) connected to the first circuit board 1082, and the flexible circuit board is connected to the display assembly 101. The first circuit board 1082 is configured to transmit the power received by the power reception structure 1042 to the display assembly 101 via a flexible circuit board, so as to supply power to the display assembly 101. Further, the first circuit board 1082 may control display content of the display assembly 101.

In this embodiment of the present disclosure, the first support plate 1081 is provided with a through hole for connecting to the second bracket 1012 in the display assembly 101, and a side, distal from the display module 1013, of the second bracket 1012 is provided with a through hole for connecting to the first support plate 1081. Through holes on the first support plate 1081 and through holes on the second bracket 1012 may be provided with screws, and the first support plate 1081 and the second bracket 1012 are connected by the screws. Further, the first support plate 1081 is provided with a first positioning structure for assembly with the second bracket 1012 of the display assembly 101, and the second bracket 1012 is provided with a first positioning structure for assembly with the first support plate 1081. The first support plate 1081 and the second bracket 1012 are assembled through the first positioning structure on the first support plate 1081 and the first positioning structure on the second bracket 1012 to ensure assembly accuracy.

As can be further seen from FIGS. 8-9, the display device 10 further includes a heat radiation assembly 109 and a second bearing 110. The heat radiation assembly 109 is fixedly connected to one end, distal from the second plate 1022, of the second cylinder 1021 of the housing assembly 102. An outer wall of the second bearing 110 is fixedly connected to the heat radiation assembly 109, the second bearing 110 is sleeved on the support shaft 1084, and the support shaft 1084 is rotatably connected to the second bearing 110. The heat radiation assembly 109 is further fixedly connected to the power transmission structure 1041.

Since the second bearing 110 is sleeved on the support shaft 1084, the second bearing 110 can provide effective support for rotation of the support shaft 1084, thereby ensuring reliability of rotation of the display assembly 101. Further, since heat generated when the display assembly 101 rotates is high, the heat radiation assembly 109 can be disposed to radiate heat in the housing assembly 102 to prevent the display assembly 101 from being damaged due to excessive temperature, thereby achieving a higher yield rate of the display assembly 101.

In this embodiment of the present disclosure, the heat radiation assembly 109 is fixedly connected to the housing assembly 102, the power transmission structure 1041 is fixedly connected to the heat radiation assembly 109, and the housing assembly 102 is not driven by the motor 103 to rotate, and thus the heat radiation assembly 109 and the power transmission structure 1041 are not rotated. Therefore, when the motor 103 drives the display assembly 101 to rotate, the driving wiring connecting the power transmission structure 1041 and the first driving power supply may be in a stationary state, and the driving wiring does not influence rotation of the display assembly 101, thereby achieving a good display effect of the display assembly 101.

Figure 13:
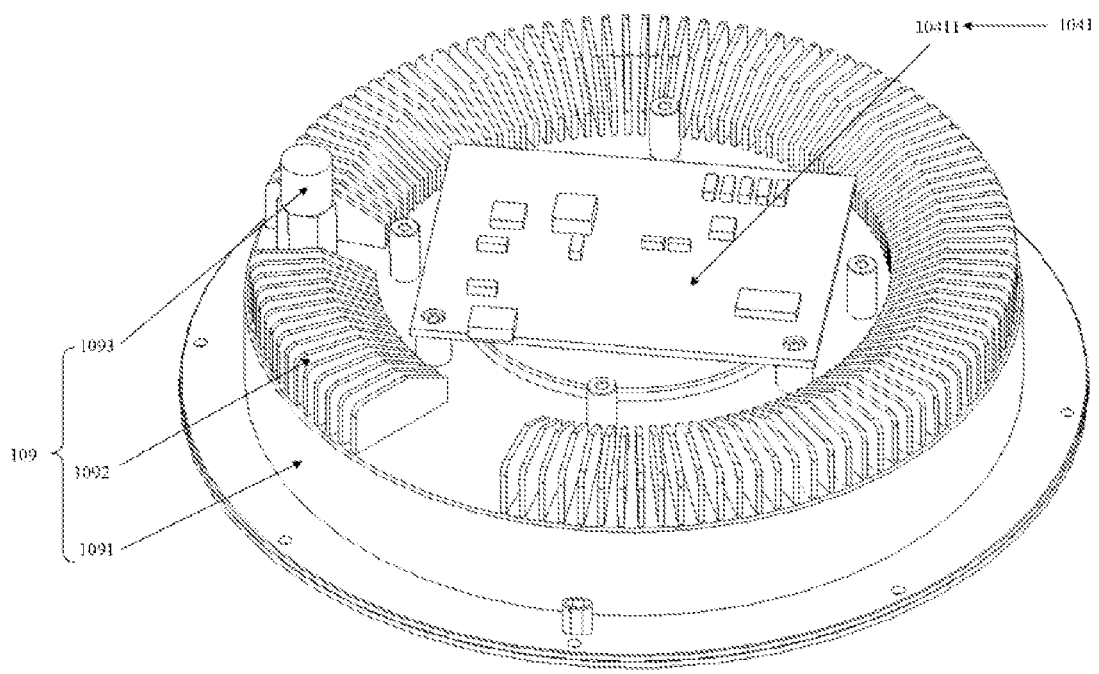
FIG. 13 is a schematic structural diagram of a heat radiation assembly and a power reception structure according to an embodiment of the present disclosure.

FIG. 13 is a schematic structural diagram of a heat radiation assembly and a power reception structure according to an embodiment of the present disclosure. As can be seen from FIG. 13, the heat radiation assembly 109 includes a heat radiation cover 1091, a heat radiation fin 1092 and a one-way valve 1093. One side of the heat radiation cover 1091 is fixedly connected to the end, distal from the second plate 1022, of the second cylinder 1021, and the other side of the heat radiation cover 1091 is fixedly connected to the heat radiation fin 1092 and the one-way valve 1093.

The heat radiation fin 1092 is used for heat radiation. The one-way valve 1093 is configured to vacuumize a space enclosed by the housing assembly 102 and the heat radiation cover 1091. The one-way valve 1093 is disposed such that air inside the space enclosed by the housing assembly 102 and the heat radiation cover 1091 can be discharged. In addition, air outside the space enclosed by the housing assembly 102 and the heat radiation cover 1091 cannot enter the area.

Figure 14:
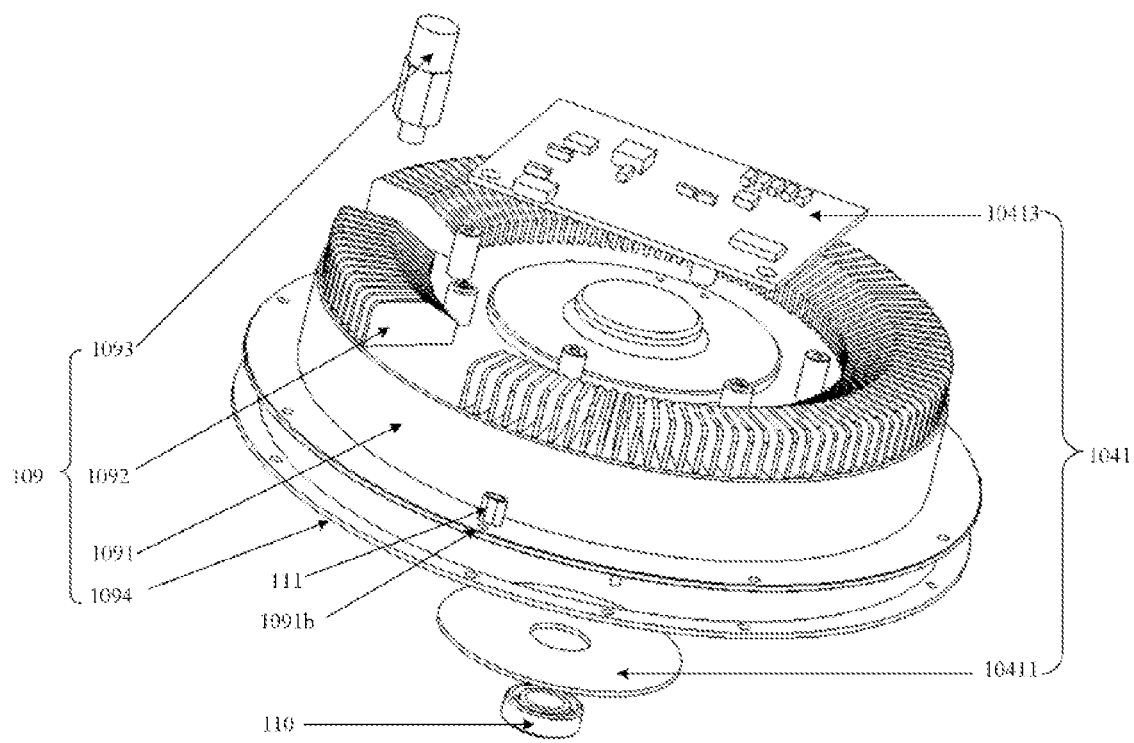
FIG. 14 is an exploded schematic diagram of the heat radiation assembly and the power reception structure shown in FIG. 13.
Figure 15:
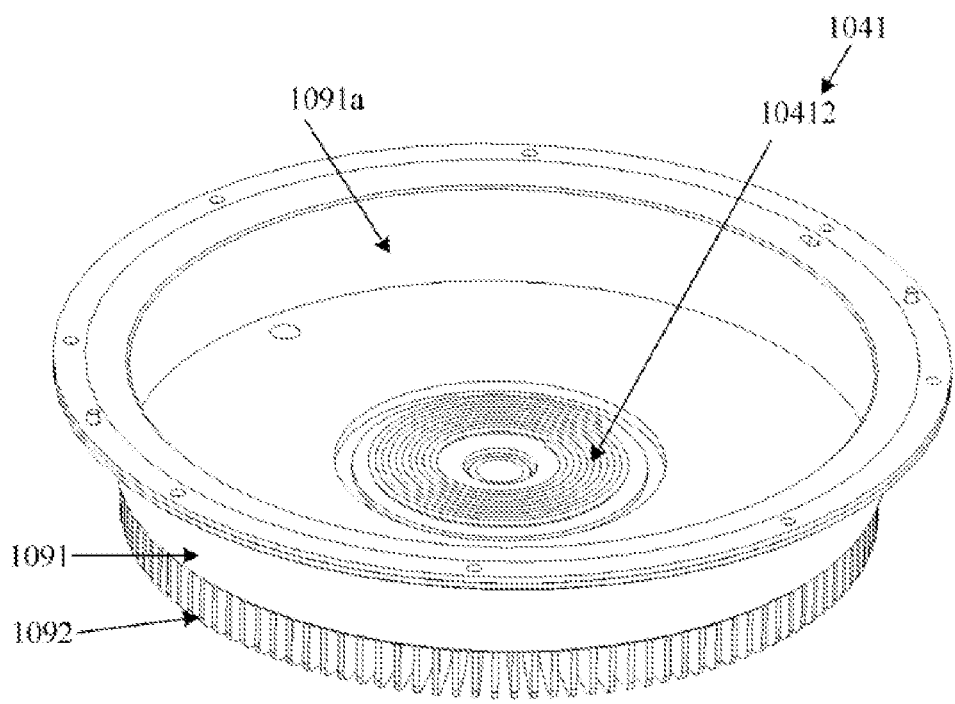
FIG. 15 is a schematic structural diagram of a heat radiation assembly and a power reception structure according to another embodiment of the present disclosure.

FIG. 14 is an exploded schematic diagram of the heat radiation assembly and the power reception structure shown in FIG. 13. FIG. 15 is a schematic structural diagram of a heat radiation assembly and a power reception structure according to another embodiment of the present disclosure. As can be seen from FIGS. 14-15, one side, proximal to the display assembly 101, of the heat radiation cover 1091 is provided with a first groove 1091a, and the power transmission structure 1041 may include a coil fixing plate 10411, a transmit coil 10412, a transmit plate 10413 and a connecting line (not shown in the figure).

The transmit coil 10412 is connected to both the coil fixing plate 10411 and the transmit plate 10413, the transmit coil 10412 and the coil fixing plate 10411 are both disposed in the first groove 1091a, and the transmit plate 10413 is disposed at a side, distal from the housing assembly 102, of the heat radiation cover 1091. The heat radiation cover 1091 is provided with a fifth through hole (not shown in the figure), one end of the connecting line is connected to the transmit coil 10412, and the other end is connected to the transmit plate 10413 through the fifth through hole. A sealant is applied to a gap between the connecting line and the fifth through hole for sealing the connecting line.

The transmit plate 10413 is configured to connect to a first driving power supply, and the first driving power supply may supply power to the transmit plate 10413. The transmit plate 10413 transmits the received power to the transmit coil 10412 over the connecting line. The transmit coil 10412 may then deliver the power to the power reception structure 1042 by electromagnetic mutual inductance.

As can be seen from FIGS. 13-14, the heat radiation cover 1091 is provided with a sixth through hole 1091b, and one end of the driving wiring is connected to the power transmission structure 1041 upon passing through the sixth through hole 1091b. Certainly, referring to FIGS. 13-14, the display device 10 further includes a column-shaped and hollow second wiring housing 111. The second wiring housing 111 is disposed at the side, distal from the housing assembly 102, of the heat radiation cover 1091, and is fixedly connected to the heat radiation cover 1091. An axis of the second wiring housing 111 is collinear with an axis of the sixth through hole 1091b.

One end of the driving wiring is connected to the power transmission structure 1041 upon passing through the sixth through hole 1091b and the second wiring housing 111. The other end of the driving wiring passes through the gap between the first wiring housing 106 and the inner wall of the second cylinder 1021 and passes through the third through hole 1022b on the second plate 1022, and is configured to be connected to the first driving power supply.

The second wiring housing 111 is disposed and the driving wiring can pass through the second wiring housing 111, such that a sealant can be applied to a gap between the driving wiring and a through hole through which it passes, so as to seal a space enclosed by the housing assembly 102 and the heat radiation assembly 109.

As can also be seen from FIG. 14, the heat radiation assembly 109 further includes a fourth gasket 1094 which is disposed at a side, distal from the heat radiation fin 1092, of the heat radiation cover 1091. In addition, the fourth gasket 1094 is bonded to the side, distal from the heat radiation fin 1092, of the heat radiation cover 1091. The fourth gasket 1094 is made of rubber.

Optionally, the heat radiation cover 1091 is provided with a first positioning structure for assembly with the fourth gasket 1094, and the fourth gasket 1094 is provided with a first positioning structure for assembly with the heat radiation cover 1091. The heat radiation cover 1091 and the fourth gasket 1094 are assembled by the first positioning structure on the heat radiation cover 1091 and the first positioning structure on the fourth gasket 1094, so as to ensure assembly accuracy.

As can also be seen from FIGS. 8-9, the display device 10 may further include an upper cover assembly 112 which is disposed at a side, distal from the housing assembly 102, of the heat radiation assembly 109 and fixedly connected to the heat radiation assembly 109. The upper cover assembly 112 is configured to encapsulate the heat radiation assembly 109, so as to improve appearance of the display device 10.

Figure 16:
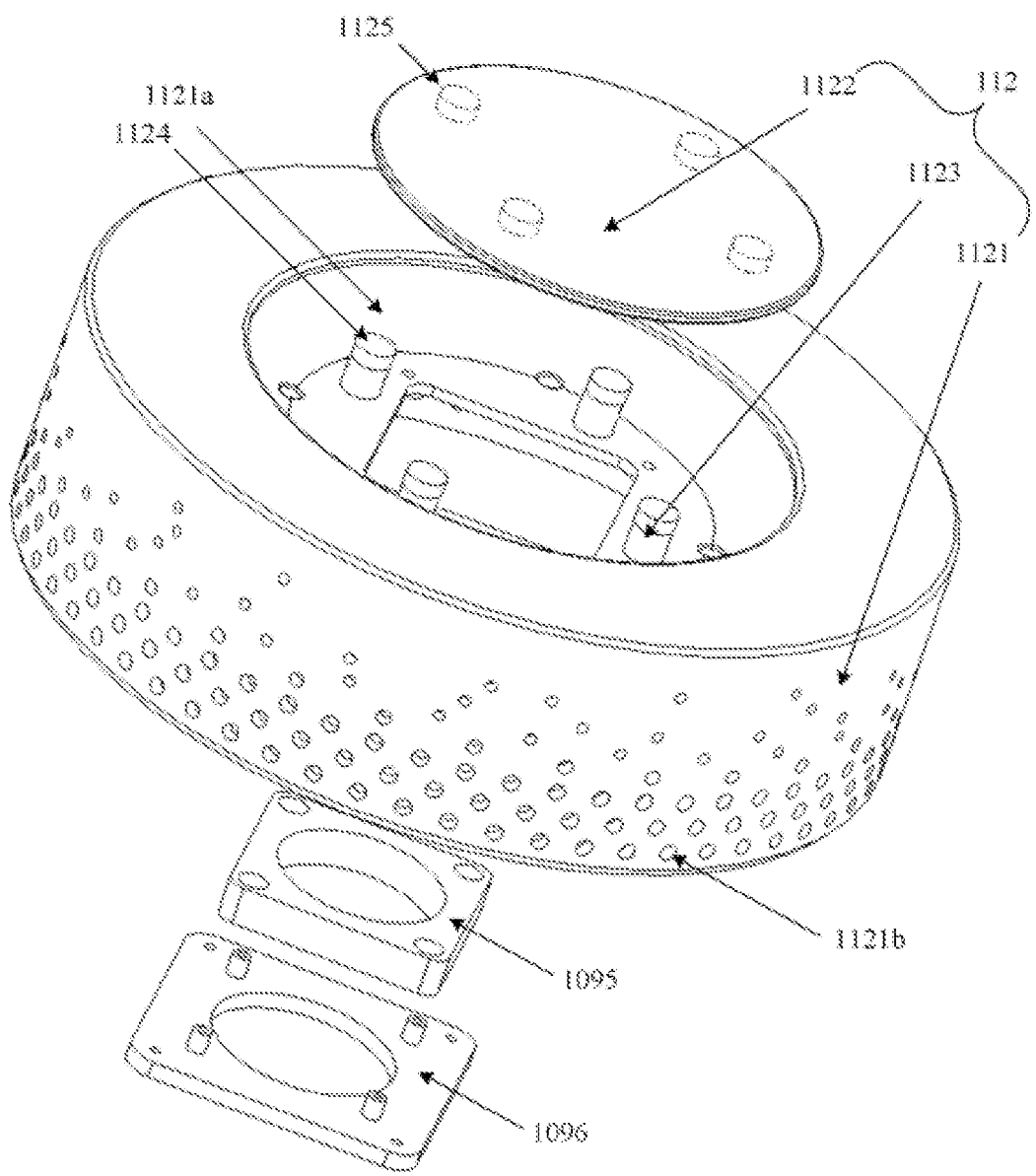
FIG. 16 is a schematic structural diagram of a heat radiation assembly and an upper cover assembly according to an embodiment of the present disclosure.

FIG. 16 is a schematic structural diagram of a heat radiation assembly and an upper cover assembly according to an embodiment of the present disclosure. Referring to FIG. 16, the heat radiation assembly 109 may further include a fan 1095 and a fan connecting plate 1096 fixedly connected to the fan 1095. The fan 1095 can be used for forced air cooling of the display device 10, so as to ensure a heat radiation effect of the heat radiation assembly 109.

Referring to FIG. 16, the upper cover assembly 112 may include a cylindrical cover body 1121 and a cover plate 1122. The fan connecting plate 1096 is disposed at and fixedly connected to a side, proximal to the housing assembly 102, of the cover body 1121. The cover plate 1122 is disposed at and fixedly connected to a side, distal from the housing assembly 102, of the cover body 1121. In other words, the fan connecting plate 1096 and the cover plate 1122 are respectively disposed on two sides of the cover body 1121, and both are fixedly connected to the cover body 1121.

In this embodiment of the present disclosure, the fan 1095 is connected to the fan connecting plate 1096 by screws, and the fan connecting plate 1096 is connected to the side, proximal to the housing assembly 102, of the cover body 1121 by screws. Certainly, the fan 1095 and the fan connecting plate 1096, and the fan connecting plate 1096 and the cover body 1121 may alternatively be connected in other ways, which is not limited in this embodiment of the present disclosure.

Referring to FIG. 16, a side, distal from the fan connecting plate 1096, of the cover body 1121 is provided with a second groove 1121a. The upper cover assembly 112 further includes at least one support column 1123, a first magnet 1124, and a second magnet 1125. Four support columns 1123 are shown in FIG. 16.

Referring to FIG. 16, each support column 1123 is disposed at the side, distal from the housing assembly 102, of the cover body 1121, one end of each support column 1123 is fixedly connected to an inner wall of the second groove 1121a, and the other end is fixedly connected to the first magnet 1124. The second magnet 1125 is disposed at a side, proximal to the second groove 1121a, of the cover plate 1122. The cover body 1121 and the cover plate 1122 are connected by using the first magnet 1124 and the second magnet 1125, thereby achieving quick assembly or disassembly.

Optionally, a total length of the support column 1123, the first magnet 1124 and the second magnet 1125 along an extending direction of the support column 1123 is equal to a depth of the second groove 1121a. Therefore, it can be ensured that the second magnet 1125 on the cover plate 1122 can contact the first magnet 1124, and reliability of connection between the cover plate 1122 and the cover body 1121 can be ensured.

In the embodiment of the present disclosure, the fan connecting plate 1096 is disposed at the side, proximal to the housing assembly 102, of the cover body 1121, and the support column 1123 is disposed at the side, distal from the housing assembly 102, of the cover body 1121. Therefore, the fan connecting plate 1096 and the support column 1123 are respectively disposed on both sides of the cover body 1121. In addition, the fan connecting plate 1096 is disposed outside the second groove 1121a, and the support column 1123 is disposed inside the second groove 1121a.

In this embodiment of the present disclosure, the cover body 1121 is fixedly connected to the heat radiation cover 1091 of the heat radiation assembly 109 for encapsulating the heat radiation assembly 109. In other words, the heat radiation assembly 109 is disposed inside the upper cover assembly 112. Therefore, a side wall of the cover body 1121 is provided with at least one heat radiation hole 1121b for heat radiation, so as to prevent the display assembly 101 from being damaged due to an excessively high temperature in the housing assembly 102.

Optionally, sizes of heat radiation holes 1121b on the cover body 1121 are different. For example, a size of the heat radiation hole 1121b at a side, proximal to the heat radiation assembly 109, of the cover body 1121 is designed to be larger, and a size of the heat radiation hole 1121b at a side, distal from the heat radiation assembly 109, of the cover body 1121 is designed to be smaller, because heat of the side, proximal to the heat radiation assembly 109, of the cover body 1121 is greater than heat of the side, distal from the heat radiation assembly 109, of the cover body 1121. In this way, heat radiated by the heat radiation assembly 109 can be radiated through the heat radiation holes 1121b on the cover body 1121. Certainly, the sizes of the heat radiation holes 1121b on the cover body 1121 may alternatively be the same, which is not limited in this embodiment of the present disclosure.

In addition, numbers of heat radiation holes 1121b provided in regions on the cover body 1121 may be different. For example, more heat radiation holes 1121b are provided at the side, proximal to the heat radiation assembly 109, of the cover body 1121, and fewer heat radiation holes 1121*b* are provided at the side, distal from the heat radiation assembly 109, of the cover body 1121. Certainly, the numbers of heat radiation holes 1121*b* in the regions on the cover body 1121 may alternatively be the same, which is not limited in this embodiment of the present disclosure.

In this embodiment of the present disclosure, the side, proximal to the housing assembly 102, of the cover body 1121 is provided with a first positioning structure for assembly with the cap 1026 of the housing assembly 102, and the cap 1026 is provided with a first positioning structure for assembly with the cover body 1121. The cover body 1121 and the cap 1026 are assembled by the first positioning structure on the cover body 1121 and the first positioning structure on the cap 1026 to ensure assembly accuracy.

As can further be seen from FIGS. 8-9, the display device may further include a hollow base assembly 113. The base assembly 113 is disposed at an end, proximal to the motor 103, of the housing assembly 102 and fixedly connected to the housing assembly 102. The motor 103 is disposed within and fixedly connected to the base assembly 113.

Since the motor 103 is disposed inside the base assembly 113, the base assembly 113 can protect the motor 103, thereby avoiding damage to the motor 103, and ensuring that the motor 103 can effectively drive the display assembly 101 to rotate.

Figure 17:
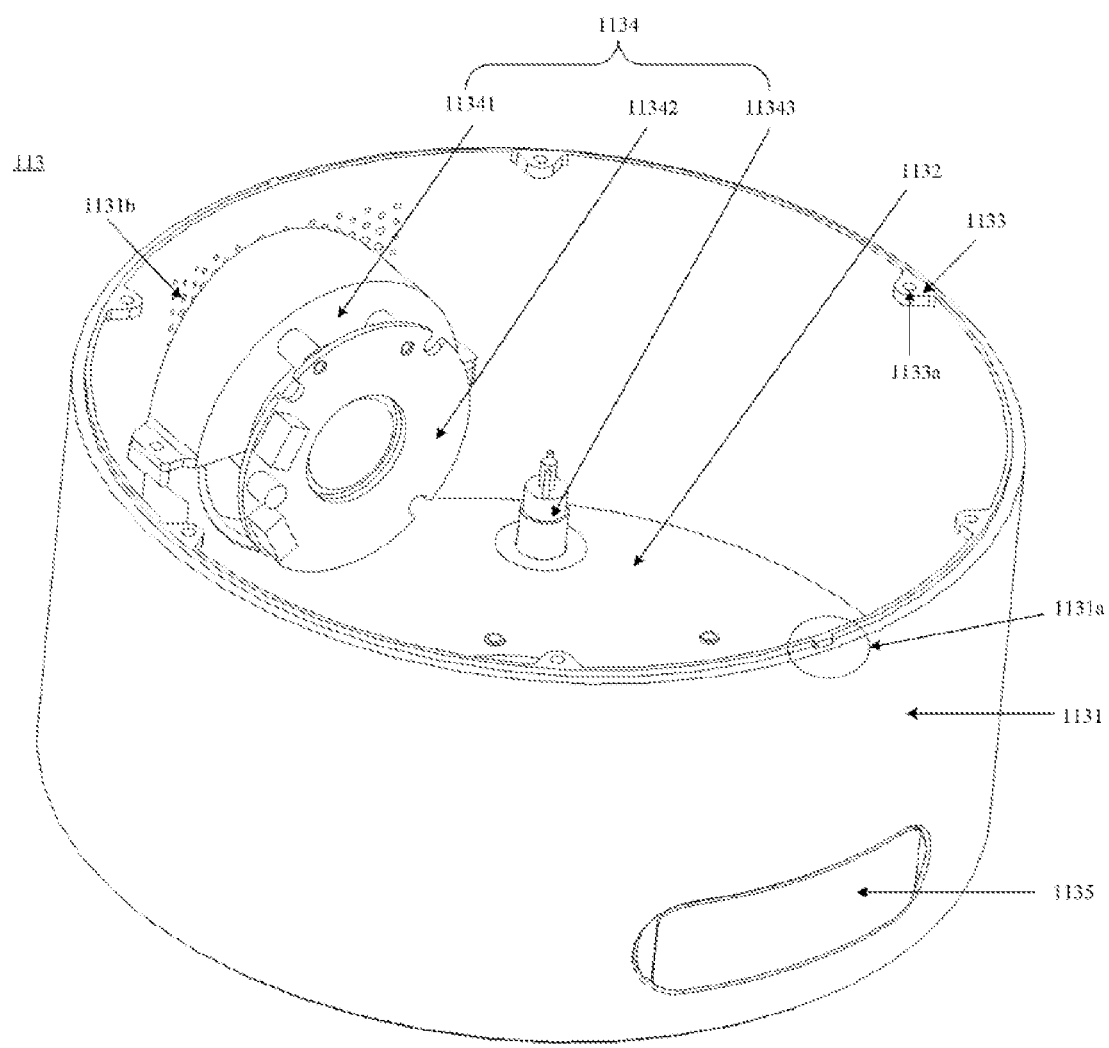
FIG. 17 is a schematic structural diagram of a base assembly according to an embodiment of the present disclosure.

FIG. 17 is a schematic structural diagram of a base assembly according to an embodiment of the present disclosure. As can be seen from FIG. 17, the base assembly 113 may include a first cylinder 1131 and a first plate 1132 fixedly connected to one end of the first cylinder 1131. Referring to FIG. 17, the base assembly 113 may further include a plurality of lugs 1133 disposed at the other end of the first cylinder 1131, each lug 1133 is provided with a through hole 1133*a*, and each through hole 1133*a* is configured to be connected to the housing assembly 102.

Optionally, the lug 1133 is connected to the first plate 1132 in the housing assembly 102 by screws. Further, a side, distal from the first plate 1132, of the first cylinder 1131 is provided with a first positioning structure 1131*a* for assembly with the second plate 1022 of the housing assembly 102, and the second plate 1022 is provided with a third positioning structure for assembly with the first cylinder 1131. The first cylinder 1131 and the second plate 1022 are assembled by the first positioning structure 1131*a* on the first cylinder 1131 and the third positioning structure on the second plate 1022.

Referring to FIG. 17, the base assembly 113 may further include an audio playing assembly 1134. The audio playing assembly 1134 is disposed within and fixedly connected to the first cylinder 1131. A side wall of the first cylinder 1131 may be provided with a plurality of sound-transmission holes 1131*b*, and a sound-transmission surface of the audio playing assembly 1134 may face the plurality of sound-transmission holes 1131*b*.

The audio playing assembly 1134 is used to play audio corresponding to images displayed by the audio display assembly 101. As a result, a user can hear the audio corresponding to the images while viewing the images displayed by the display assembly 101, and therefore user experience is better.

Referring to FIG. 17, the audio playing assembly 1134 may include an audio player 11341, an audio playing circuit board 11342 and a switch button 11343 that are all disposed within the first cylinder 1131. The audio player 11341 is connected to an inner wall of the first cylinder 1131. The audio playing circuit board 11342 is distal from the inner wall of the first cylinder 1131 relative to the audio player 11341, and is connected to the audio player 11341 for driving the audio player 11341 to play audio. The switch button 11343 is fixedly connected to the first plate 1132 and configured to control the audio player 11341 to be turned on or off.

Optionally, the audio player 11341 may be a speaker, and the audio playing circuit board 11342 may be a speaker circuit board.

Figure 18:
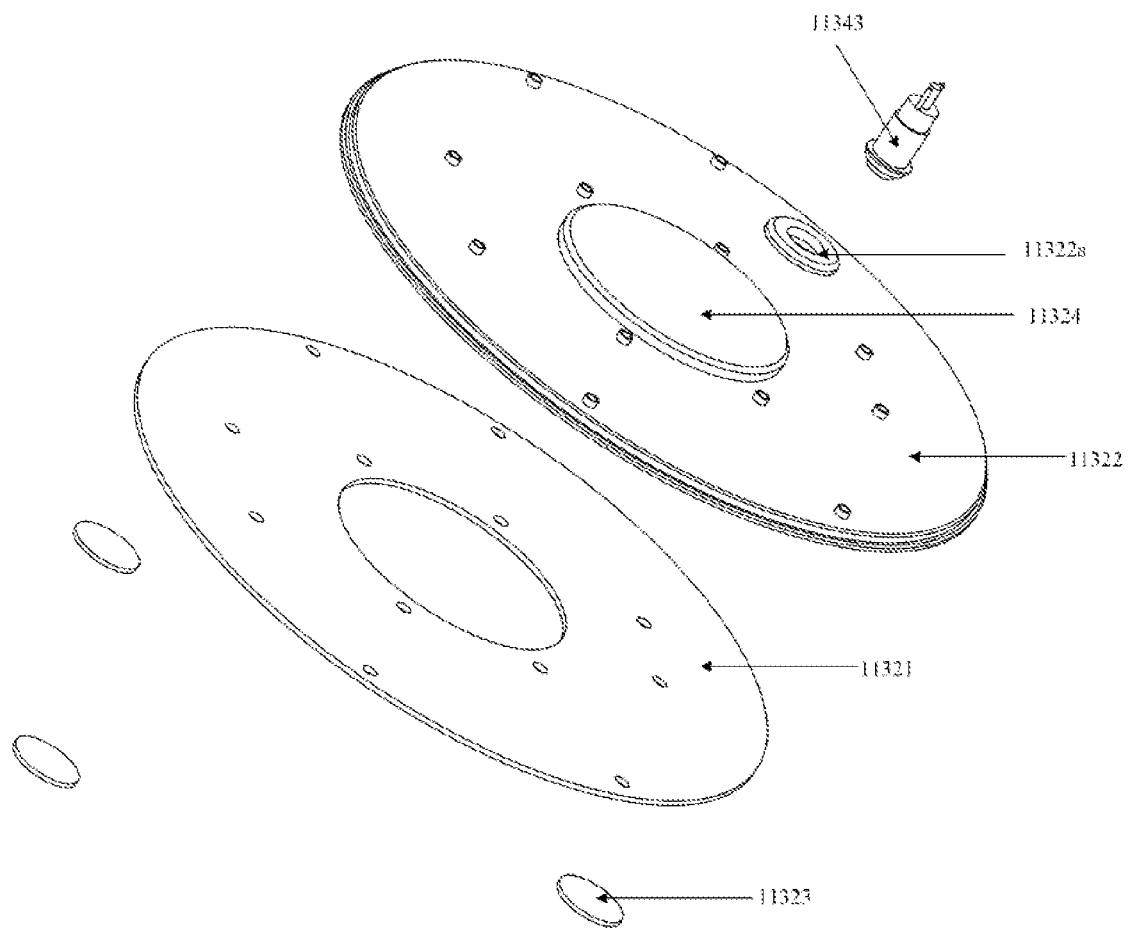
FIG. 18 is a schematic structural diagram of a first plate according to an embodiment of the present disclosure.

In this embodiment of the present disclosure, referring to FIG. 18, the first plate 1132 may include a plate body 11321, and a cushion 11322 and a support cushion 11323 which are fixedly connected to the plate body 11321. The cushion 11322 covers a side, proximal to the first cylinder 1131, of the plate body 11321, and the support cushion 11323 is disposed at a side, distal from the first cylinder 1131, of the plate body 11321. Optionally, the support cushion 11323 and the plate body 11321 may be bonded by a double-sided tape.

In order to ensure stability of the first plate 1132 supporting other devices, the first plate 1132 may include a plurality of support cushions 11323 which are evenly distributed at the side, distal from the first cylinder 1131, of the plate body 11321. Three support cushions 11323 are shown in FIG. 18.

In this embodiment of the present disclosure, the motor 103 and the motor housing 107 are fixedly connected and placed on the first plate 1132, and is in contact with a side, distal from the plate body 11321, of the cushion 11322. Further, a side, distal from the plate body 11321, of the support cushion 11323 is in contact with a working surface (for example, the ground, a desktop, or the like).

When the motor 103 is in a working state, the motor 103 may vibrate. Therefore, the cushion 11322 is disposed, to provide a buffer for the motor 103, thereby effectively reducing vibration of the motor 103, and ensuring that the display device 10 can work normally. Further, the support cushion 11323 is disposed, such that stability of the base assembly 113 on the working surface is ensured, and the display device 10 is prevented from shaking, that is, stability of the display device is improved.

In this embodiment of the present disclosure, the switch button 11343 of the audio playing assembly 1134 is fixedly connected to the plate body 11321 in the first plate 1132. Since the side, proximal to the first cylinder 1131, of the plate body 11321 is provided with the cushion 11322, to prevent the cushion 11322 from affecting a setting of the switch button 11343, the cushion 11322 is provided with a through hole 11322*a* for passing through the switch button 11343. One end of the switch button 11343 is fixedly connected to the plate body 11321 upon passing through the through hole 11322*a*.

Optionally, the plate body 11321 and the cushion 11322 are connected to the motor housing 107 by screws. In addition, the plate body 11321 and the cushion 11322 are provided with first positioning structures for assembly with the motor housing 107, and the motor housing 107 is provided with second positioning structures for assembly with the plate body 11321 and the cushion 11322. The plate body 11321, the cushion 11322 and the motor housing 107 are assembled by first positioning structures on the plate body 11321 and the cushion 11322, and second positioning structures on the motor housing 107.

In this embodiment of the present disclosure, after the motor 103 and the motor housing 107 are assembled, the bottom surface (a surface distal from the display assembly 101) of the motor 103 is proximal to the display assembly 101 relative to the bottom surface (a surface distal from the display assembly 101) of the motor housing 107. Therefore, referring to FIG. 18, the first plate 1132 may further include a protruding structure 11324 disposed at the side, distal from the plate body 11321, of the cushion 11322. One side of the protruding structure 11324 is in contact with the bottom surface of the motor 103, and the bottom surface of the motor housing 107 is in contact with the cushion 11322, to ensure that the first plate 1132 can provide support for both the motor 103 and the motor housing 107, and further ensure structural stability of the display device 10.

Optionally, the protruding structure 11324 and the cushion 11322 are an integral structure, and the cushion 11322, the support cushion 11323 and the protruding structure 11324 are all made of rubber.

Figure 19:
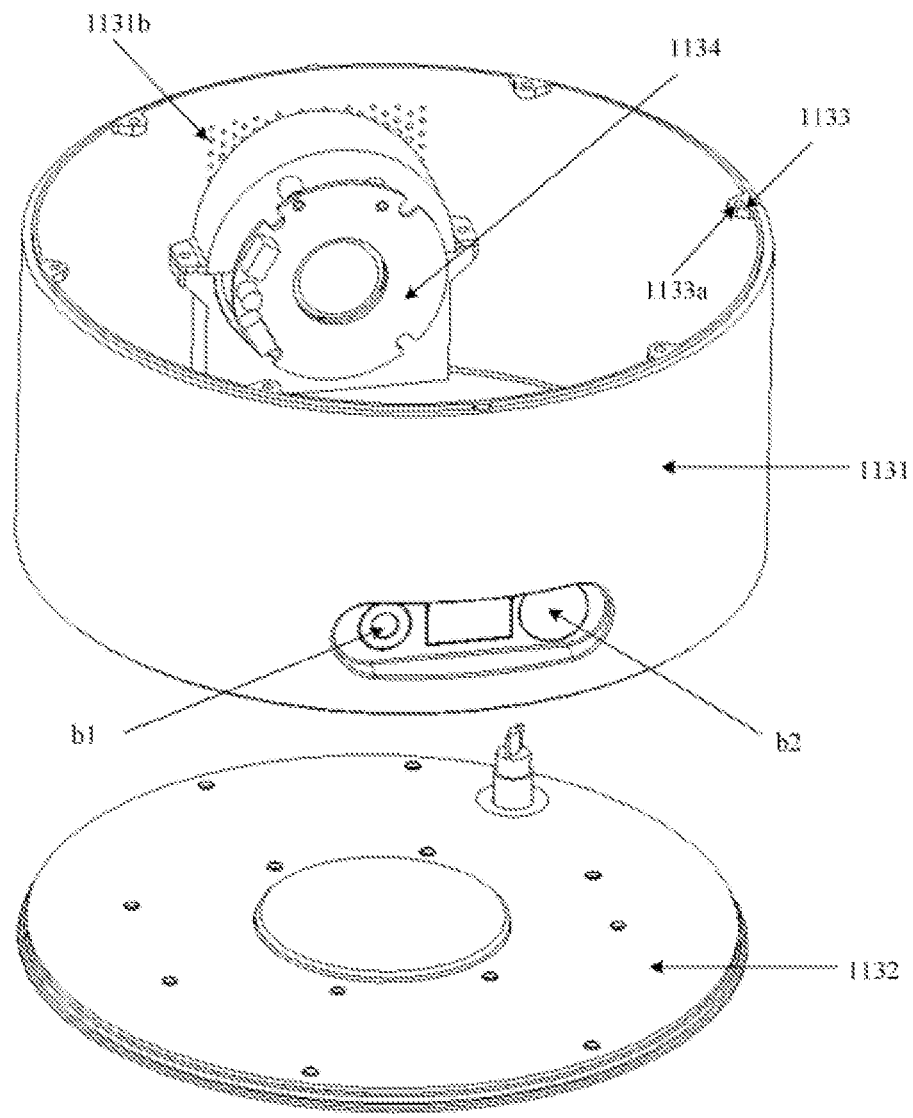
FIG. 19 is an exploded schematic diagram of the base assembly shown in FIG. 17.

FIG. 19 is an exploded schematic diagram of the base assembly shown in FIG. 17. Referring to FIG. 19, the side wall of the first cylinder 1131 is provided with a first power supply interface b1 and a second power supply interface b2.

The first power supply interface b1 is connected to the driving assembly 104 over the driving wiring and is configured to be connected to the first driving power supply. Therefore, after the first driving power supply is connected to the first power supply interface b1, the first power supply interface b1 can supply power to the driving assembly 104 over the driving wiring, such that the driving assembly 104 can drive the display assembly 101 to display images.

Further, the second power supply interface b2 is connected to the power supply lead wire of the motor 103 and is configured to be connected to a second driving power supply. Therefore, after the second driving power supply is connected to the second power supply interface b2, the second driving power supply can supply power to the motor 103 over the power supply lead wire of the motor 103, such that the motor 103 can drive the display assembly 101 to rotate.

In this embodiment of the present disclosure, the base assembly 113 may include a rubber plug 1135 configured to seal the first power supply interface b1 and the second power supply interface b2.

In the case where neither the first driving power supply and the first power supply interface b1 nor the second driving power supply and the second power supply interface b2 are connected, in order to prevent an undesired substance (such as dust or water vapor) from entering the first power supply interface b1 and the second power supply interface b2, the rubber plug 1135 is disposed within the first power supply interface b1 and the second power supply interface b2. In this way, impact of the undesired substance on the first power supply interface b1 and the second power supply interface b2 can be avoided, and reliability of connection between the first driving power supply and the first power supply interface b1 and connection between the second driving power supply and the second power supply interface b2 can be ensured.

In this embodiment of the present disclosure, steps of assembling the display device 10 may include the following:

1. The motor 103 is disposed inside the motor housing 107, and the motor 103 is fixedly connected to the motor housing 107 by screws.
2. The motor housing 107 is fixedly connected to the housing assembly 102 by screws.
3. The motor 103 and the motor housing 107 are placed into the first cylinder 1131 of the base assembly 113, and the first cylinder 1131 in the base assembly 113 is fixedly connect to the housing assembly 102 by screws.
4. The first plate 1132 is fixedly connected to the first cylinder 1131 in the base assembly 113 by screws, and the first plate 1132 is fixedly connected to the motor housing 107 disposed inside the first cylinder 1131 by screws.
5. The flexible circuit board in the circuit assembly 108 is connected to the display module 1013 in the display assembly 101, and the first support plate 1081 in the circuit assembly 108 is connected to the second bracket 1012 in the display assembly 101 by screws.
6. The connecting shaft 1014 in the display assembly 101 is disposed within the first bearing 105 which is fixedly connected to the housing assembly 102, and the output shaft 1032 of the motor 103 is disposed in the fourth through hole of the connecting shaft 1014.
7. The support shaft 1084 in the circuit assembly 108 is disposed within the second bearing 110 which is fixedly connected to the heat radiation assembly 109, and the heat radiation assembly 109 is connected to the housing assembly 103.
8. The cover body 1121 in the upper cover assembly 112 is fixedly connected to the heat radiation assembly 109 by screws.
9. The cover body 1121 is connected to the cover plate 1122 by the first magnet 1124 and the second magnet 1125.

Optionally, during an assembly process of the display device 10, when two of multiple structures need to be connected, positioning may be performed first by corresponding positioning structures on the two structures. Then the two structures are fixedly connected by screws. In this way, accuracy of assembly of each structure in the display device can be ensured, and therefore a display effect of the display device is ensured.

In summary, according to the display device provided by an embodiment of the present disclosure, a power transmission structure can deliver power provided by a first driving power supply to a power reception structure by electromagnetic mutual inductance, and the power reception structure can further deliver power to a display assembly. Since the power transmission structure is independent from the display assembly, when the display assembly is driven by a motor to rotate, a driving wiring that connects the power transmission structure and the first driving power supply does not influence the rotation of the display assembly, thereby achieving a good display effect of the display device.

Figure 20:
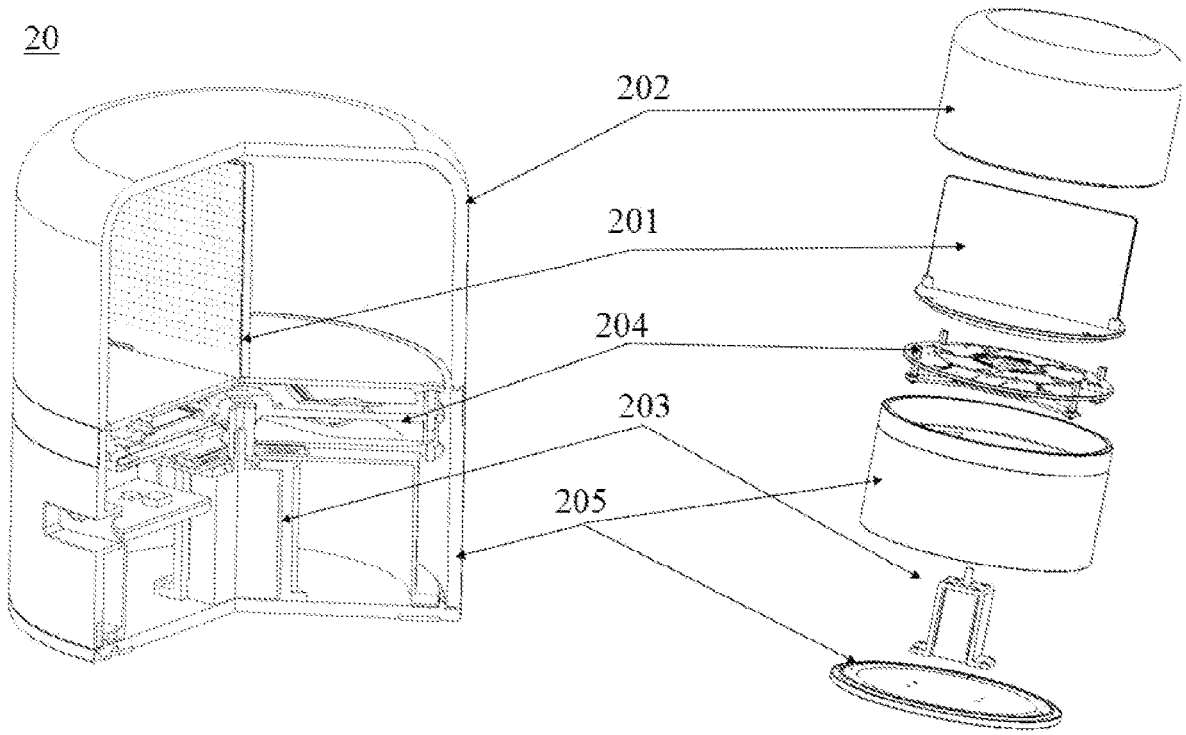
FIG. 20 is a schematic structural diagram of a display device according to another embodiment of the present disclosure.

FIG. 20 is a schematic structural diagram of a display device according to another embodiment of the present disclosure. As can be seen from FIG. 20, the display device 20 may include a display assembly 201, a hollow housing assembly 202, a motor 203, a driving assembly 204 and a hollow base assembly 205.

The display assembly 201 is disposed in the hollow housing assembly 202. The motor 203 connected to the display assembly 201 and configured to drive the display assembly 201 to rotate. The driving assembly 204 is connected to the display assembly 201 and configured to drive the display assembly 201 to display images. The hollow base assembly 205 disposed at a side, proximal to the motor 203, of the housing assembly 202 and fixedly connected to the housing assembly 202, and the motor 203 is disposed within and fixedly connected to the base assembly 205. In this way, when the motor 203 drives the display assembly 201 to rotate, the driving assembly 204 drives the display assembly 201 to display images, thereby achieving a 3D image effect.

Referring to FIG. 1, the driving assembly 204 includes a power transmission structure 2041 and a power reception structure 2042. The power transmission structure 2041 is independent from the display assembly 201 and wiredly connected to a first driving power supply. The first driving power supply is configured to supply power to the power transmission structure 2041. The power reception structure 2042 is wiredly connected to the display assembly 201, and the power transmission structure 2041 is capable of delivering power to the power reception structure 2042 by electromagnetic mutual inductance. In this way, the power reception structure 2042 can deliver received power to the display assembly 201, such that the display assembly 201 can display images.

Since the power reception structure 2042 is wiredly connected to the display assembly 201, the power reception structure 2042 can rotate synchronously with the display assembly 201 when the motor 203 drives the display assembly 201 to rotate. The power transmission structure 2041 independent from the display assembly 201 does not rotate synchronously with the display assembly 201. In this way, the driving wiring that connects the first driving power supply and the power transmission structure 2041 does not influence the rotation of the display assembly 201, thereby ensuring a display effect of the display device.

In summary, according to the display device provided by an embodiment of the present disclosure, a power transmission structure can deliver power provided by a first driving power supply to a power reception structure by electromagnetic mutual inductance, and the power reception structure can further deliver power to a display assembly. Since the power transmission structure is independent from the display assembly, when the display assembly is driven by a motor to rotate, a driving wiring that connects the power transmission structure and the first driving power supply does not influence the rotation of the display assembly, thereby achieving a good display effect of the display device.

Figure 21:
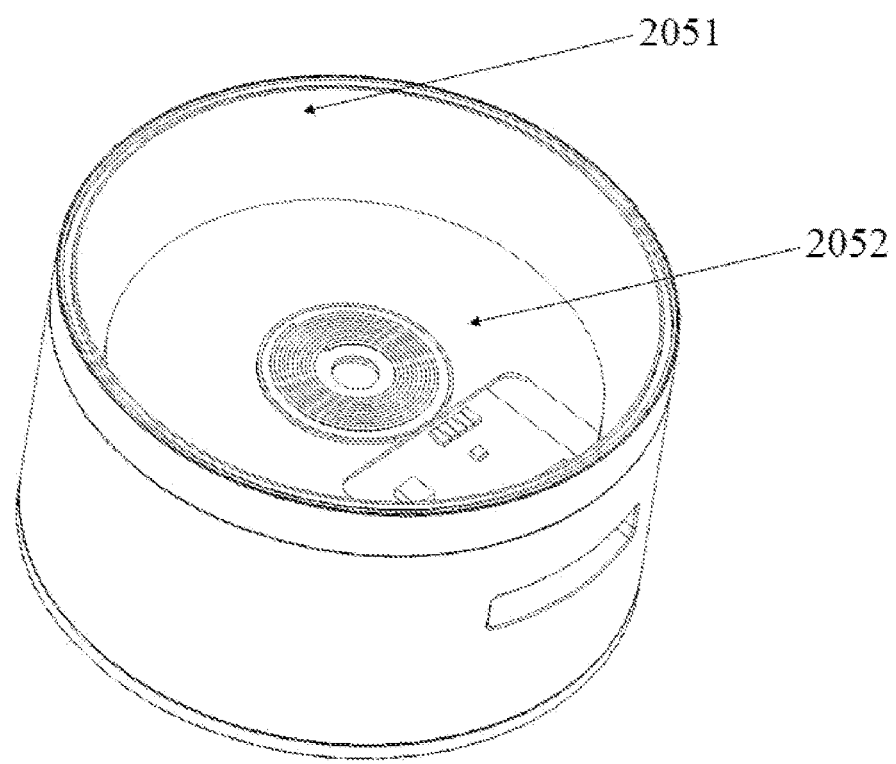
FIG. 21 is a schematic structural diagram of a base assembly according to an embodiment of the present disclosure.
Figure 22:
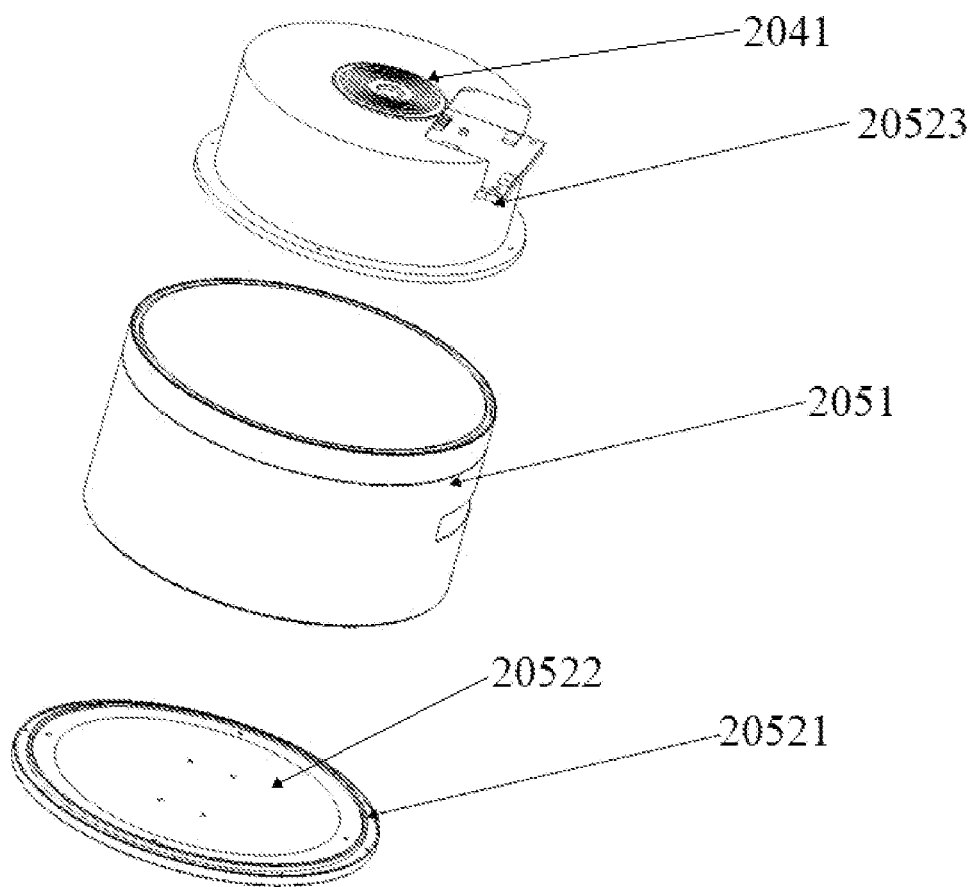
FIG. 22 is an exploded schematic diagram of the base assembly shown in FIG. 21.

FIG. 21 is a schematic structural diagram of a base assembly according to an embodiment of the present disclosure, and FIG. 22 is an exploded schematic diagram of the base assembly shown in FIG. 21. Referring to FIG. 21 and FIG. 22, the base assembly 205 includes a first cylinder 2051 and a first plate 2052 which is fixedly connected to the bottom end of the first cylinder 2051. The first plate 2052 includes a plate body 20521, a cushion 20522 which is fixedly connected to the plate body 20521, and a base bracket 20523. The plate body 20521 is a circular plate as a base support. The cushion 20522 covers a side, proximal to the first cylinder 2051, of the plate body 20521, and may be made of elastic material, rubber for example, to improve structural stability. The base bracket 20523 is in the shape of a basin (which has an opening for connecting structures to pass through) upside down on the plate body 20521, thereby providing arrangement space and support for the power transmission structure 2041 and providing shelter and protection for the motor 203.

In some possible implementations, a side wall of the first cylinder 2051 is provided with a first power supply interface and a second power supply interface, which are not fully shown in the FIG. 20, FIG. 21 and FIG. 22 but can be arranged in the same way as the first power supply interface b1 and a second power supply interface b2 shown in FIG. 19. In some examples, the first power supply interface is connected to the driving assembly 204 and configured to be connected to the first driving power supply; and the second power supply interface is connected to the motor 203 and configured to be connected to a second driving power supply, and the second driving power supply is configured to supply power to the motor 203. In some possible implementations, the base assembly 205 further includes a rubber plug configured to seal the first power supply interface and the second power supply interface, and the rubber plug can be arranged in the same way as the rubber plug 1135 shown in FIG. 19.

In some possible implementations, the first plate 2052 further includes a support cushion disposed at a side, distal from the first cylinder 2051, of the plate body 20521, and fixedly connected to the plate body 20521. The support cushion is not shown in the FIG. 20, FIG. 21 and FIG. 22, but can be arranged in the same way as the support cushion 11323 shown in FIG. 18 and helps to improve stability of the display device.

Figure 23:
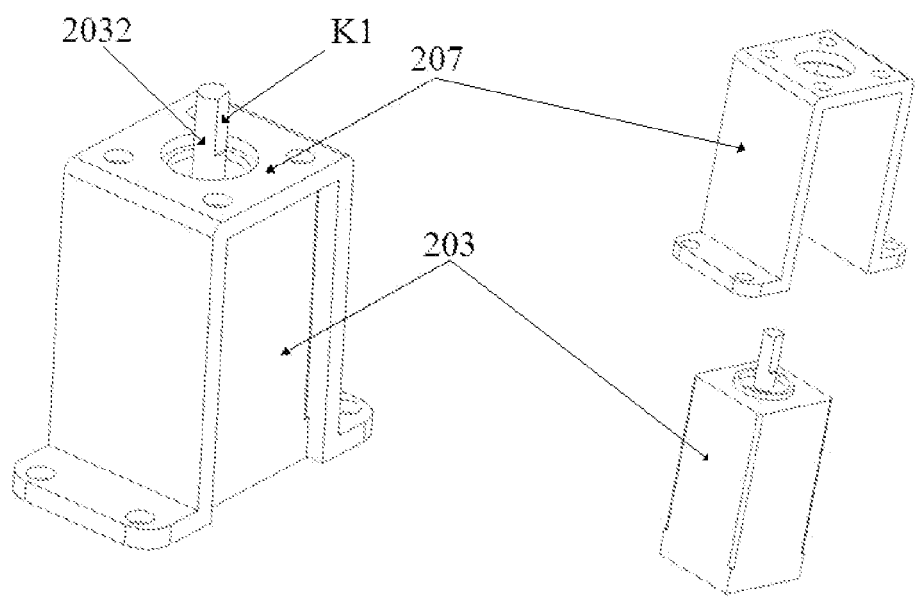
FIG. 23 is a schematic structural diagram of a motor according to an embodiment of the present disclosure.

FIG. 23 is a schematic structural diagram of a motor according to an embodiment of the present disclosure. Referring to FIG. 20 and FIG. 23, the display device 20 further includes a motor housing 207, and the motor housing 207 is fixedly connected to the motor 203 and the first plate 2052. The motor 203 is fixed in the center of the first plate 2052 by the motor housing 207 which is fixedly connected to the first plate 2052, and the motor housing 207 includes a through hole for the output shaft 2032 of the motor 203 to pass through. In this way, the motor 203 is fixed in the center of the first plate 2052 by the motor housing 207, providing the ability to steadily drive other components to rotate through the output shaft 2032. In some possible implementations, the output shaft 2032 of the motor 203 includes at least one flat key structure K1 to improve stability of rotation.

Figure 24:
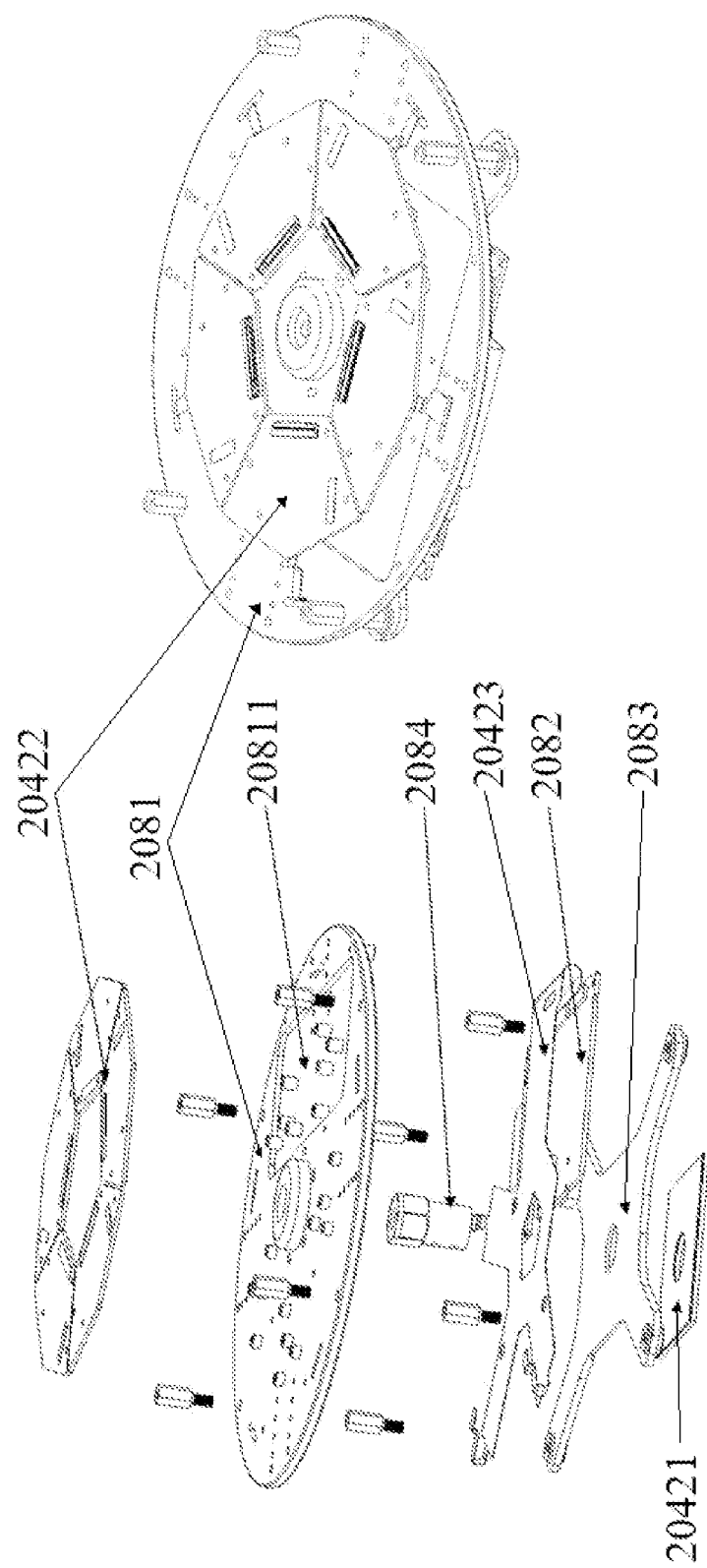
FIG. 24 is a schematic structural diagram of a circuit assembly and a driving assembly according to an embodiment of the present disclosure.

FIG. 24 is a schematic structural diagram of a circuit assembly and a driving assembly according to an embodiment of the present disclosure. Referring to FIG. 20 and FIG. 24, the display device 20 further includes a circuit assembly 208, the circuit assembly 208 includes a first support plate 2081, a first circuit board 2082, a second support plate 2083, and a support shaft 2084, and the power reception structure 2042 includes a receiving plate 20421 and a second circuit board 20422. The circuit assembly 208 is fixedly connected to both the display assembly 201 and the power reception structure 2042 and configured to drive the display assembly 201 to display the images under an action of power received by the power reception structure 2042.

Referring to FIG. 24, the receiving plate 20421 is provided with a first through hole in the center. The first circuit board 2082 is disposed between the first support plate 2081 and the second support plate 2083. The first support plate 2081 is fixedly connected to both the first circuit board 2082 and the second support plate 2083. The side, distal from the second support plate 2083, of the first support plate 2081 is fixedly connected to the display assembly 201. The side, distal from the first support plate 2081, of the second support plate 2083 is fixedly connected to the receiving plate 20421. The side, distal from the first support plate 2081, of the second support plate 2083 is fixedly connected to the support shaft 2084, an axis of the support shaft 2084 is perpendicular to the second support plate 2083. The support shaft 2084 is disposed in the first through hole in the center of the receiving plate 20421. The side, distal from the second support plate 2083, of the first support plate 2081 is fixedly connected to the second circuit board 20422. And, the side, distal from the first support plate 2081, of the second circuit board 20422 is fixedly connected to the display assembly 201. The above means of fixing may include being fixed by connectors (such as screws), gluing, etc. . . . .

In this way, both the circuit assembly 208 and the driving assembly 204 are fixed with the display assembly 201. The support shaft 2083 is fixedly connected to an output shaft 2032 of the motor 203, to allow the circuit assembly 208 and the driving assembly 204 to synchronously rotate with the display assembly 201 when driven by the motor 203.

To improve stability of the rotation, the components of the circuit assembly 208 and the driving assembly 204 can be designed to be as symmetrical as possible with respect to the axis of rotation. For example, the second circuit board 20422 is provided with a hole in the center for the support shaft 2083 to pass through, the hole has a shape of a regular pentagon, and an outer edge of the second circuit board 20422 has a shape of regular decagon. In this way, the stability of rotation can be improved because its center of gravity is on the axis of rotation.

In some possible implementations, the power reception structure 2042 further includes a first flexible circuit board 20423, the first support plate 2081 has an opening 20811, and the first circuit board 2082 of the circuit assembly 208 is connected to the second circuit board 20422 through the first flexible circuit 20423 which passes through the opening 20811 of the first support plate 2081, thereby the connection between the second circuit board 20422 and the first circuit board 2082 can be achieved.

Figure 25:
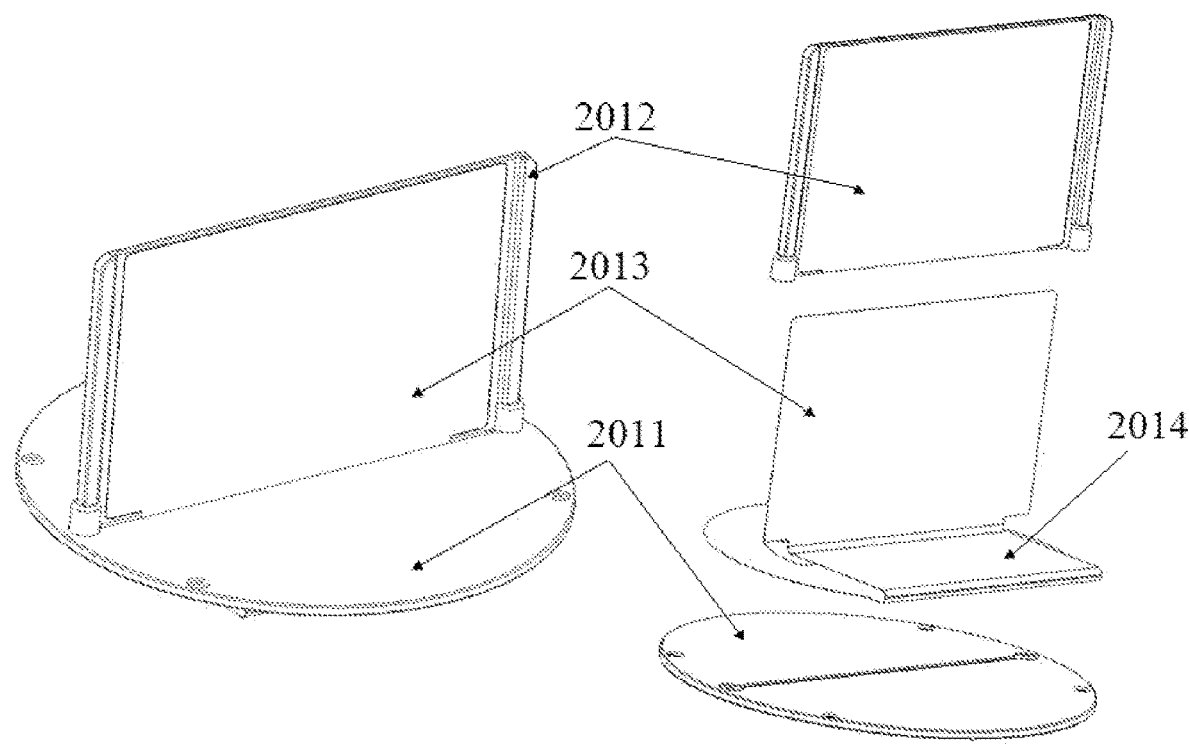
FIG. 25 is a schematic structural diagram of a display assembly according to an embodiment of the present disclosure.

FIG. 25 is a schematic structural diagram of a display assembly according to an embodiment of the present disclosure. Referring to FIG. 20 and FIG. 25, the display assembly 201 includes circular plate 2011, a backplane bracket 2012 and a display module 2013. The base of the backplane bracket 2012 is fixedly connected to the side, distal from the driving assembly 204, of the circular plate 2011. The backplane bracket 2012 provides a mounting surface, which is perpendicular to the circular plate 2012, for the display module 2013. The display module 2013 is fixedly mounted to the backplane bracket 2012. In this way, the display module 2013 is fixed vertically and approximately symmetrical about the axis of rotation, thereby improving the stability of rotation. The circular plate 2011 can be made from high strength materials such as carbon fiber, and the display module 2013 can be firmly attached to the backplane bracket 2012 by means of e.g. double-sided adhesive.

In some possible implementations, the display assembly 201 further includes a second flexible circuit board 2014, and the display module 2013 is connected to the driving assembly 204 through the second flexible circuit board 2014.

Figure 26:
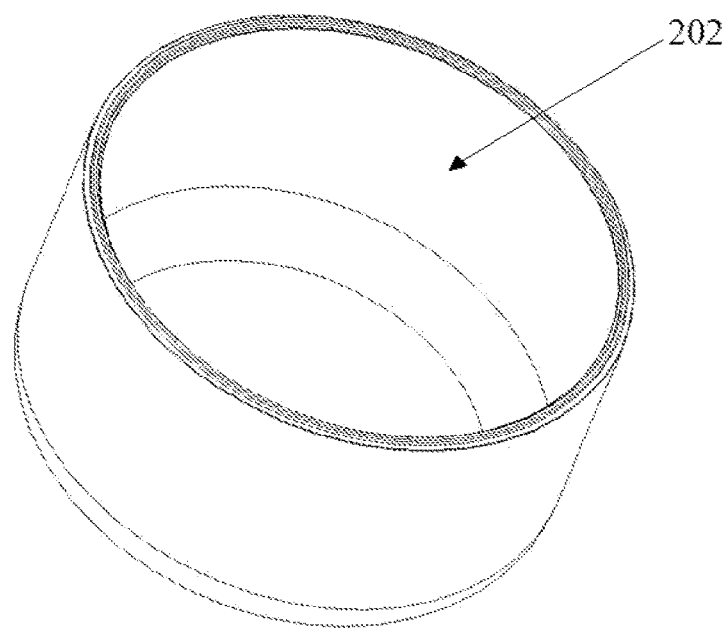
FIG. 26 is a schematic structural diagram of a housing assembly according to an embodiment of the present disclosure.

FIG. 26 is a schematic structural diagram of a housing assembly according to an embodiment of the present disclosure. The housing assembly 202 is approximately a cylindrical shell with a closed top and an open bottom. The cylindrical surface of the housing assembly 202 can be transparent or translucent, allowing the display module 2013 to be seen from the outside.

It should be understood that the different embodiments in this disclosure can be cross-referenced or combined into a new embodiment, which is not limited in this disclosure. The above descriptions are merely embodiments of the present disclosure, and are not intended to limit the present disclosure. Any modifications, equivalent substitutions or improvements that are made within the spirit and principle of the present disclosure should all be included in the protection scope of claims of the present disclosure.

What is claimed is:

1. A display device, comprising:
 a display assembly;
 a hollow housing assembly, wherein the display assembly is disposed in the housing assembly;
 a motor connected to the display assembly and configured to drive the display assembly to rotate;
 a driving assembly connected to the display assembly and configured to drive the display assembly to display images; and
 a hollow base assembly disposed at a side, proximal to the motor, of the housing assembly and fixedly connected to the housing assembly, the motor being disposed within and fixedly connected to the base assembly;
 wherein the driving assembly comprises a power transmission structure and a power reception structure, wherein the power transmission structure is independent from the display assembly and wiredly connected to a first driving power supply, and the power reception structure is wiredly connected to the display assembly and capable of delivering power to the power reception structure by electromagnetic mutual inductance; and
 the base assembly comprises a first cylinder and a first plate fixedly connected to one end of the first cylinder; the first plate comprises a plate body, and a cushion which is fixedly connected to the plate body; and, the cushion covers a side, proximal to the first cylinder, of the plate body.

2. The display device according to claim 1, wherein the first plate further comprises a support cushion which is fixedly connected to the plate body, and the support cushion is disposed at a side, distal from the first cylinder, of the plate body.

3. The display device according to claim 1, further comprising a motor housing;
 wherein the motor housing is fixedly connected to the motor and one of the housing assembly and the first plate.

4. The display device according to claim 3, wherein the motor is fixed in a center of the first plate by the motor housing which is fixedly connected to the first plate, and the motor housing comprises a through hole for an output shaft of the motor to pass through.

5. The display device according to claim 4, wherein the output shaft of the motor comprises at least one flat key structure.

6. The display device according to claim 1, further comprising a circuit assembly;
 wherein the circuit assembly is fixedly connected to both the display assembly and the power reception structure and configured to drive the display assembly to display the images under an action of power received by the power reception structure.

7. The display device according to claim 6, wherein the power reception structure comprises a receiving plate, the receiving plate being provided with a first through hole, and the circuit assembly comprises a first support plate, a first circuit board, a second support plate, and a support shaft; wherein
 the first circuit board is disposed between the first support plate and the second support plate, the first support plate is fixedly connected to both the first circuit board and the second support plate, a side, distal from the second support plate, of the first support plate is fixedly connected to the display assembly, and a side, distal from the first support plate, of the second support plate is fixedly connected to the receiving plate; and
 the side, distal from the first support plate, of the second support plate is fixedly connected to the support shaft, an axis of the support shaft is perpendicular to the second support plate, and the support shaft is disposed in the first through hole.

8. The display device according to claim 7, wherein the power reception structure further comprises a second circuit board; the side, distal from the second support plate, of the first support plate is fixedly connected to the second circuit board, and the side, distal from the first support plate, of the second circuit board is fixedly connected to the display assembly.

9. The display device according to claim 8, wherein the power reception structure further comprises a first flexible circuit board, the first support plate has an opening, and the first circuit board of the circuit assembly is connected to the second circuit board through the first flexible circuit board which passes through the opening of the first support plate.

10. The display device according to claim 8, wherein the second circuit board is provided with a hole in a center, and the support shaft passes through the hole.

11. The display device according to claim 10, wherein the hole has a shape of a regular pentagon, and an outer edge of the second circuit board has a shape of regular decagon.

12. The display device according to claim 7, wherein the support shaft is fixedly connected to an output shaft of the motor, to allow the power reception structure to synchronously rotate with the display assembly when driven by the motor.

13. The display device according to claim 7, further comprising a heat radiation assembly and a second bearing; wherein
the heat radiation assembly is fixedly connected to one end, distal from the second support plate, of a second cylinder of the housing assembly;
an outer wall of the second bearing is fixedly connected to the heat radiation assembly, the second bearing is sleeved on the support shaft, and the support shaft is rotatably connected to the second bearing; and
the heat radiation assembly is further fixedly connected to the power transmission structure.

14. The display device according to claim 13, further comprising an upper cover assembly;
wherein the upper cover assembly is disposed at a side, distal from the housing assembly, of the heat radiation assembly and fixedly connected to the heat radiation assembly.

15. The display device according to claim 14, wherein the heat radiation assembly further comprises a fan and a fan connecting plate fixedly connected to the fan, and the upper cover assembly comprises a cylindrical cover body and a cover plate; wherein the fan connecting plate is disposed at and fixedly connected to a side, proximal to the housing assembly, of the cover body; and
the cover plate is disposed at and fixedly connected to a side, distal from the housing assembly, of the cover body.

16. The display device according to claim 15, wherein a side, distal from the fan connecting plate, of the cover body is provided with a second groove, and the upper cover assembly further comprises at least one support column, a first magnet, and a second magnet; wherein
each of the at least one support column is disposed at the side, distal from the housing assembly, of the cover body, one end of the each of the at least one support column is fixedly connected to an inner wall of the second groove, and the other end of the each of the at least one support column is fixedly connected to the first magnet; and
the second magnet is disposed at a side, proximal to the second groove, of the cover plate.

17. The display device according to claim 1, wherein a side wall of the first cylinder is provided with a first power supply interface and a second power supply interface; wherein
the first power supply interface is connected to the driving assembly and configured to be connected to the first driving power supply; and
the second power supply interface is connected to the motor and configured to be connected to a second driving power supply, and the second driving power supply is configured to supply power to the motor.

18. The display device according to claim 17, wherein the base assembly further comprises a rubber plug configured to seal the first power supply interface and the second power supply interface.

19. The display device according to claim 1, wherein the display assembly comprises a circular plate, a backplane bracket and a display module; a base of the backplane bracket is fixedly connected to a side, distal from the driving assembly, of the circular plate, the backplane bracket provides a mounting surface, which is perpendicular to the circular plate, for the display module, and the display module is fixedly mounted to the backplane bracket.

20. The display device according to claim 19, wherein the display assembly further comprises a second flexible circuit board, and the display module is connected to the driving assembly through the second flexible circuit board.

* * * * *